United States Patent
Takimoto et al.

(10) Patent No.: US 6,949,809 B2
(45) Date of Patent: Sep. 27, 2005

(54) LIGHT RECEIVING ELEMENT, LIGHT DETECTOR WITH BUILT-IN CIRCUITRY AND OPTICAL PICKUP

(75) Inventors: Takahiro Takimoto, Tenri (JP); Isamu Ohkubo, Kashiba (JP); Masaru Kubo, Kitakatsuragi-gun (JP); Hiroki Nakamura, Osakasayama (JP); Toshihiko Fukushima, Nara (JP); Toshifumi Yoshikawa, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 224 days.

(21) Appl. No.: 10/283,323

(22) Filed: Oct. 30, 2002

(65) Prior Publication Data

US 2003/0080280 A1 May 1, 2003

(30) Foreign Application Priority Data

Oct. 31, 2001 (JP) .................................. 2001-335610
Oct. 3, 2002 (JP) .................................. 2002-291712

(51) Int. Cl.$^7$ ............................................. H01L 31/06
(52) U.S. Cl. ................ 257/463; 257/233; 257/292; 257/461; 257/464; 438/48; 438/87

(58) Field of Search ................. 257/233, 292, 257/461, 463, 464, E31.115, E27.133, E25.032; 438/48, 87

(56) References Cited

U.S. PATENT DOCUMENTS

| 4,586,068 A | * | 4/1986 | Petroff et al. ............... 257/438 |
| 6,583,482 B2 | * | 6/2003 | Pauchard et al. ........... 257/438 |
| 2004/0065911 A1 | * | 4/2004 | Lixin ........................ 257/292 |

* cited by examiner

Primary Examiner—Nathan J. Flynn
Assistant Examiner—Scott R. Wilson
(74) Attorney, Agent, or Firm—Nixon & Vanderhye P.C.

(57) ABSTRACT

A light receiving element, comprising a semiconductor structure comprising at least a first conductivity type semiconductor layer, a first, second conductivity type semiconductor layer provided on the first conductivity type semiconductor layer in the semiconductor structure, a second, second conductivity type semiconductor layer having an impurity concentration lower than that of the first, second conductivity type semiconductor layer, a second, first conductivity type semiconductor layer provided on the second, second conductivity type semiconductor layer, or a second, first conductivity type semiconductor layer provided within the second, second conductivity type semiconductor layer.

31 Claims, 15 Drawing Sheets

FIG.1
(a)
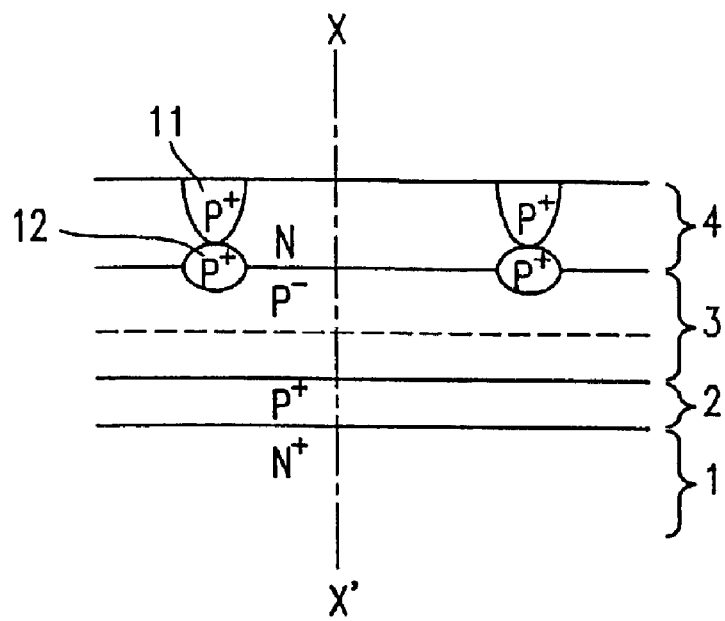
(b)
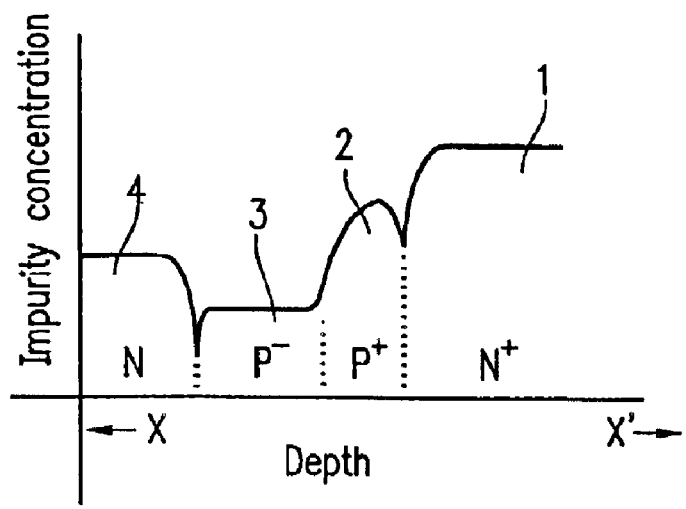

FIG.2
(a)
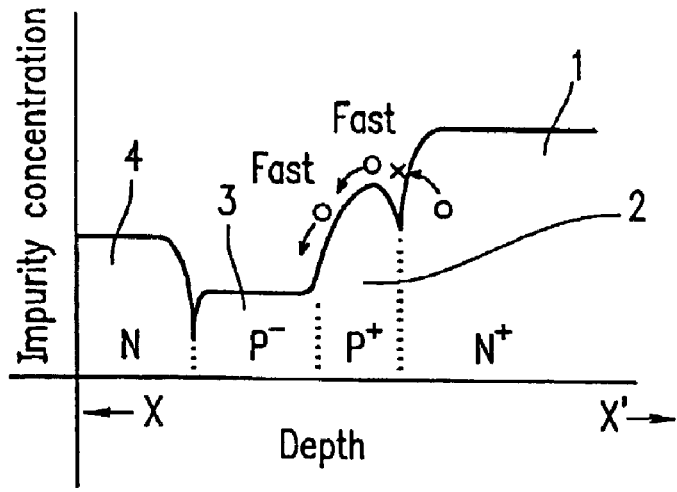
(b)
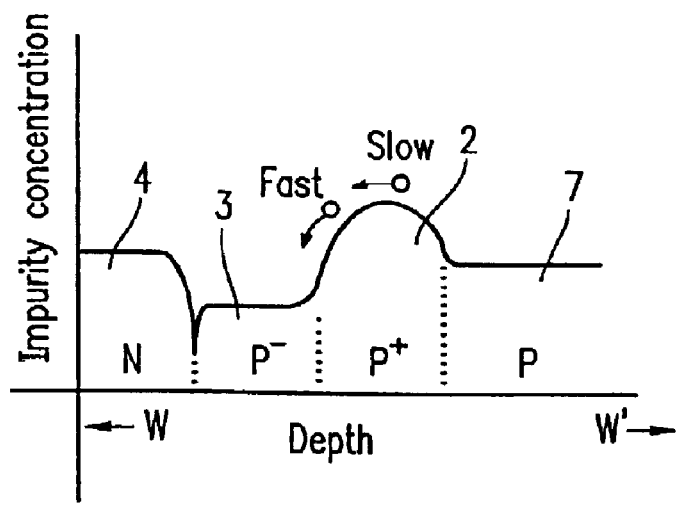

FIG. 4
(a)
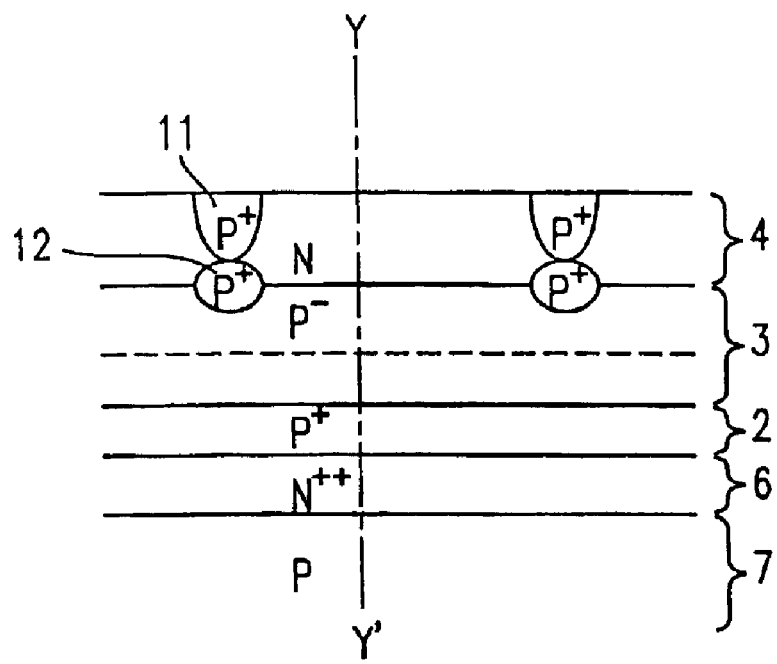
(b)
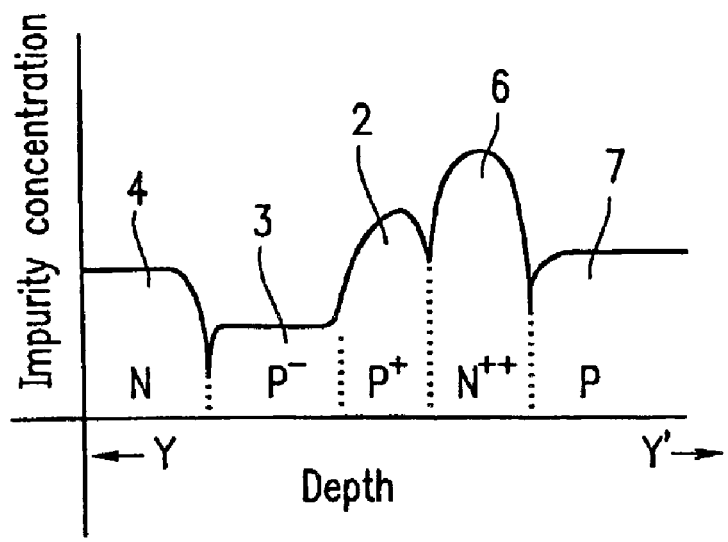

FIG.5
(a)
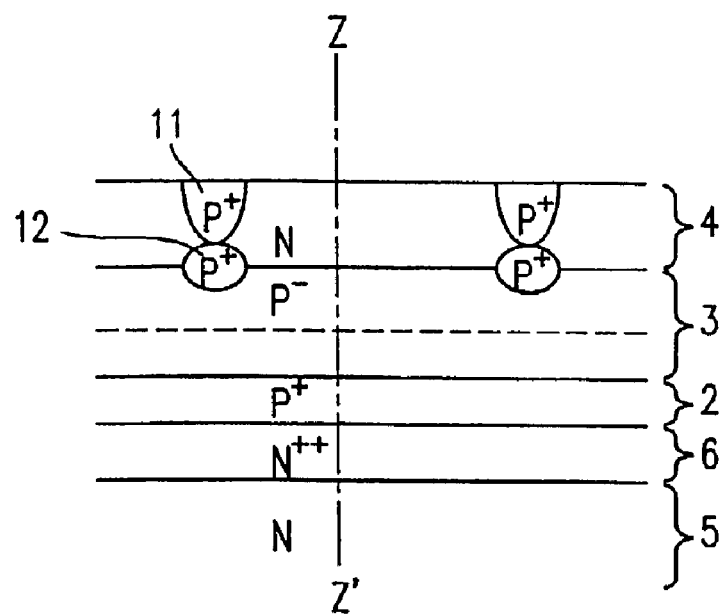
(b)
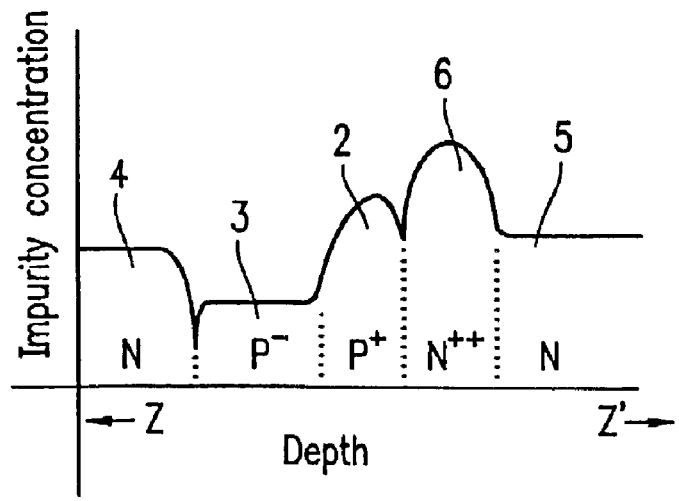

FIG. 13
(a)
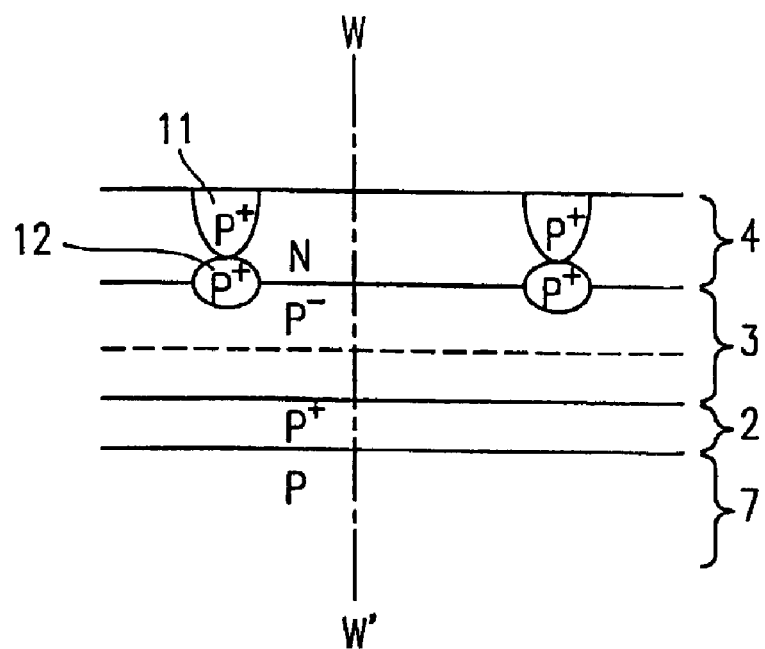
(b)
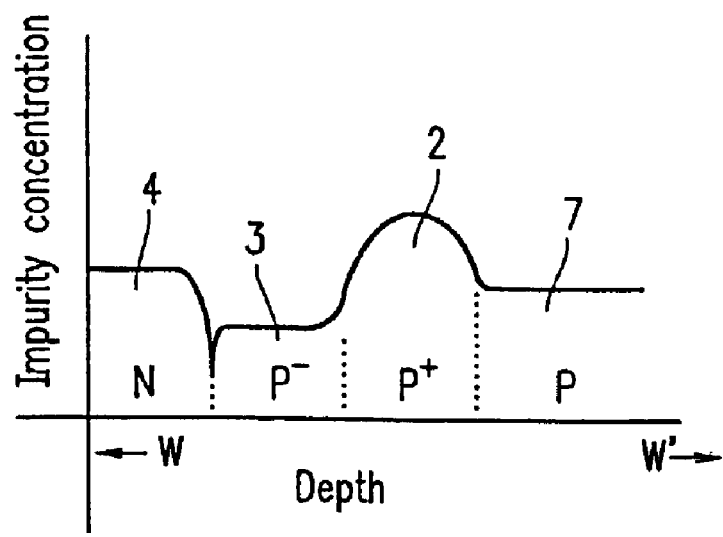
PRIOR ART

LIGHT RECEIVING ELEMENT, LIGHT DETECTOR WITH BUILT-IN CIRCUITRY AND OPTICAL PICKUP

BACKGROUND OF THE INVENTION

1. Field of the Invention

The present invention relates to a light receiving element for use in writing data to, and reading data from, an optical disk, such as CD-R/RW, DVD-RAM, or the like. The present invention also relates to a light detector comprising the light receiving element and built-in circuitry, and an optical pickup comprising the light detector.

2. Description of the Related Art

Photodiodes (PDs), which are light receiving elements, are semiconductor devices which convert incident light through their light receiving surfaces to an electrical signal. The PDs are used for optical pickups of optical disk apparatuses which write data onto an optical disk, such as CD-R/RW, DVD-R/RW, DVD-RAM, or the like.

FIG. 12 is a schematic diagram showing a configuration of an optical pickup comprising a photodiode. This optical pickup comprises a semiconductor laser (laser diode) LD for irradiating a predetermined portion of the information recording side of an optical disk 34 (e.g., CD-R/RW) with light for writing data, and a photodiode PD for converting light reflected from the predetermined portion of the information recording side of the optical disk 34 to an electrical signal. The photodiode PD has five light detecting portions D1 to D5.

Laser light emitted from the semiconductor laser LD is split by a tracking beam generating diffraction grating 30 provided between the semiconductor laser LD and a hologram element 31 into three laser beams, i.e., two subbeams for tracking and a main beam for reading information signals. These laser beams are transmitted through the hologram element 31 as zero-order light, and are made parallel by a collimating lens 32, and are condensed by an object lens 33 to form a beam spot on the information recording side of the optical disk 34. Digital information (bit information) is recorded on the tracks of the information recording side of the optical disk 34 by means of formation of pits and lands, magnetic modulation, refractive index modulation, or the like.

The laser beam condensed onto a track of the information recording side of the optical disk 34 is modulated by pits, which are arranged in accordance with information recorded on the track, and is then reflected from the information recording side of the optical disk 34. The reflected light from the information recording side of the optical disk 34 is transmitted through the object lens 33 and the collimating lens 32, diffracted by the hologram element 31, and directed onto the light detecting portion D1 to D5 of the photodiode PD as first-order diffracted light.

The hologram element 31 has two regions with different diffraction pitches, i.e., regions 31a and 31b. A portion of the reflected main beam for reading information signals, which is directed onto one of the two regions of the hologram element 31, is condensed onto a dividing line, which separates the light detecting portions D2 and D3 of the photodiode PD. The other portion of the reflected main beam is directed onto the other region of the hologram element 31, and is condensed onto the light detecting portion D4 of the photodiode PD. The reflected subbeams for tracking are condensed via the hologram element 31 onto the respective light detecting portions D1 and D5 of the photodiode PD.

In the optical pickup of FIG. 12, the position of the photodiode PD onto which the reflected main beam for reading information signals is condensed, is moved in a direction traversing the light detecting portions D2 and D3 depending on the distance between the hologram element 31 and the optical disk 34. When the main beam for reading information signals is brought into focus on the information recording side of the optical disk 34, the reflected main beam is directed onto the dividing line between the light detecting portions D2 and D3 of the photodiode PD.

The outputs of the light detecting portions D1 to D5 are represented by S1 to S5, respectively. A focusing error signal FES is given by:

$$FES = S2 - S3.$$

Tracking error is detected by condensing the two subbeams for tracking onto the respective light detecting portions D1 and D5 of the photodiode PD, and obtaining a tracking error signal TES. The tracking error signal TES is given by:

$$TES = S1 - S5.$$

When the tracking error signal TES is 0, the main beam for reading information signals is condensed onto a target track on the information recording side of the optical disk 34.

A reproduction (read out) signal RF for reading data on the information recording side of the optical disk 34 is given as the sum of the outputs of the light detecting portions D2 to D4 of the photodiode PD receiving the reflected main beam for reading information signals, i.e., $$RF = S2 + S3 + S4.$$

In this manner, the photodiode PD of the optical pickup detects the reproduction signal RF of reflected light containing a data signal recorded on the information recording side of the optical disk 34. The photodiode PD also detects the focusing error signal FES, which is a focusing signal for adjusting the focus of laser light from the semiconductor laser LD, and the tracking error signal TES, which is an address signal for verifying a position on the information recording side of the optical disk 34 which is irradiated with the laser light. With the focusing error signal FES and the tracking error signal TES detected by the photodiode PD, the optical pickup is controlled so that laser light emitted by the semiconductor laser LD toward the optical disk 34, in which data is recorded, is accurately directed onto a predetermined position on the information recording side of the optical disk 34.

Recently, an optical disk apparatus employing such an optical pickup has been used to write or read a huge amount of data (e.g., video data) to or from an optical disk. As the data amount of an optical disk is increased, there is an increasing demand for a reduction in time required to write data to, or read data from, the optical disk. To meet the demand, a rate at which data is written to or read from the information recording side needs to be increased (e.g., 16× speed, 32× speed, etc.).

Optical pickups for an optical disk apparatus adopt a light detector in which a light receiving element (e.g., the photodiode PD shown in FIG. 12) is integrated with a signal processing circuit on the same device (a light detector with built-in circuitry). A high-speed operation of a photodiode is required for increasing the data write/read rate to the information recording side of an optical disk. To meet the requirement, it is important to improve the response speed of the photodiode to incident light.

The response speed of the photodiode is determined mainly by a CR time constant defined by the junction capacitance (C) of the depletion layer in a PN junction region and the series resistance (R) of a cathode region, an anode region, and the like, and the movement time required for photocarriers generated in a semiconductor layer deeper than the depletion layer to be diffused from the generation region to an end of the depletion layer due to the difference in the photocarrier concentration. The smaller the CR time constant and the shorter the movement time of photocarriers, the faster the response speed of the photodiode.

In the optical disk apparatus, the writing of data to the information recording side of an optical disk is carried out by changing the shape or phase of a pigment on the information recording side of the optical disk with the heat of laser light from the semiconductor laser LD. Therefore, in order to reduce the write time of data to the information recording side of an optical disk, the light power of laser light emitted from the semiconductor laser LD to the information recording side of the optical disk needs to be increased so as to enhance the amount of light. In this case, the amount of light (reflected light), which is reflected from the information recording side of the optical disk and enters the photodiode PD, is increased. As the amount of the reflected light entering the photodiode PD is increased, the photocarriers generated within the semiconductor layer constituting the photodiode are accumulated in the vicinity of the PN junction region. The accumulation of the photocarriers narrows the width of the depletion layer, leading to a phenomenon that the junction capacitance increases. As a result, the cut-off frequency of the photodiode PD is lowered, and therefore the response speed of the photodiode PD may be reduced.

As to the reduction in the response speed of the photodiode PD due to the photocarrier accumulation, if the width of the depletion layer in the PN junction region of the photodiode PD is limited and the intensity of the electric field within the depletion layer is increased, the width of the depletion layer can be prevented from being narrowed due to the accumulation of the photocarriers generated within the semiconductor layer in the vicinity of the PN junction region.

However, if the width of the depletion layer in the PN junction region of the photodiode PD is limited, the photocarriers generated within the semiconductor layer deeper than the depletion layer, due to light entering the light receiving surface of the photodiode PD, are gradually moved from the semiconductor layer deeper than the depletion layer to an end of the depletion layer by diffusion due to the difference in the photocarrier concentration, so that the movement time of the photocarrier is elongated. The increase in the photocarrier movement time may reduce the response speed of the photodiode.

A solution to such a problem is disclosed in Japanese Laid-Open Publication No. 2001-77401 (Publication 1).

FIG. 13A is a cross-sectional view showing a photodiode disclosed in Publication 1. FIG. 13B is a graph showing the impurity concentration distribution of a cross section of the photodiode taken along line W–W' in FIG. 13A.

The photodiode shown in FIG. 13A comprises a low resistivity P-type semiconductor substrate 7, and a $P^+$-type buried diffusion layer 2 having a higher impurity concentration than that of the substrate 7, a high resistivity P-type epitaxial layer 3 having a lower impurity concentration than that of the substrate 7, and an N-type epitaxial layer 4, which are laminated in this order on the substrate 7. Thus, the photodiode has a multilayer structure. At an interface between the high resistivity P-type epitaxial layer 3 and the N-type epitaxial layer 4, a plurality of $P^+$-type separation buried diffusion layers 12 are provided in predetermined regions. A $P^+$-type separation buried diffusion layer 11 is provided on the $P^+$-type separation buried diffusion layer 12 in the N-type epitaxial layer 4. A surface of the $P^+$-type separation buried diffusion layer 11 is exposed from a surface of the N-type epitaxial layer 4. Thus, in FIG. 13A, the photodiode is provided in a region surrounded by the $P^+$-type separation buried diffusion layer 12 and the $P^+$-type separation buried diffusion layer 11 on the high resistivity P-type epitaxial layer 3.

The impurity concentration distribution of the photodiode in FIG. 13A from the surface to the inside is shown in FIG. 13B.

The impurity concentration of the N-type epitaxial layer 4 is designed to be distributed uniformly from the surface of the photodiode to the PN junction region at the interface between the N-type epitaxial layer 4 and the high resistivity P-type epitaxial layer 3.

In the PN junction region at the interface between the N-type epitaxial layer 4 and the high resistivity P-type epitaxial layer 3, the impurity concentrations of the N-type epitaxial layer 4 and the high resistivity P-type epitaxial layer 3 are compensated by each other and both concentrations are steeply reduced. Therefore, in the PN junction region, a strong electric field is generated, which is directed toward the junction interface from the N-type epitaxial layer 4 and the high resistivity P-type epitaxial layer 3.

The impurity concentration of the high resistivity P-type epitaxial layer 3 is designed to be uniformly distributed and to be lower than the impurity concentration of the N-type epitaxial layer 4 except for the PN junction region.

The impurity concentration of the $P^+$-type buried diffusion layer 2 is designed to be higher than the impurity concentration of the high resistivity P-type epitaxial layer 3, and to have a curved profile with a peak of the impurity concentration. Therefore, a portion of the $P^+$-type buried diffusion layer 2 between a region having the peak of the impurity concentration and the high resistivity P-type epitaxial layer 3, has a higher potential than that of the high resistivity P-type epitaxial layer 3. As a result, an internal electric field is generated in the $P^+$-type buried diffusion layer 2 from the region having the peak of the impurity concentration toward the high resistivity P-type epitaxial layer 3.

The impurity concentration of the low resistivity P-type semiconductor substrate 7 is designed to be uniformly distributed and to be lower than the peak of the impurity concentration of the $P^+$-type buried diffusion layer 2. Therefore, the potential of the region of the $P^+$-type buried diffusion layer 2 having the peak of the impurity concentration, functions as a potential barrier against electrons in the low resistivity P-type semiconductor substrate 7.

In the thus-constructed photodiode, a reduced proportion of the photocarriers, which are generated within the low resistivity P-type semiconductor substrate 7 deeper than the $P^+$-type buried diffusion layer 2, due to light entering the light receiving surface of the photodiode (i.e., the surface of the N-type epitaxial layer 4), can go beyond the $P^+$-type buried diffusion layer 2 and reach the PN junction region at the interface between the high resistivity P-type epitaxial layer 3 and the N-type epitaxial layer 4. This is because the potential of a portion of the $P^+$-type buried diffusion layer 2 nearer the low resistivity P-type semiconductor substrate 7 functions as a potential barrier against the potential of the low resistivity P-type semiconductor substrate 7. Therefore, a large amount of photocarriers generated in the low resistivity P-type semiconductor substrate 7 cannot reach the PN junction region due to the potential barrier of the P⁺-type buried diffusion layer 2, and are subjected to recombination in the low resistance low resistivity P-type semiconductor substrate 7 to be extinguished.

Accordingly, in the photodiode shown in FIGS. 13A and 13B, the number of photocarriers, which are generated in a deep site within the photodiode, and are moved over a long distance up to the end of the depletion layer (i.e., the PN junction region formed at the interface between the high resistivity P-type epitaxial layer 3 and the N-type epitaxial layer 4) caused by diffusion due to the difference in the photocarrier concentration, can be reduced. As a result, a reduction in the response speed of the photodiode can be prevented.

If the difference in the impurity concentration between the high resistivity P-type epitaxial layer 3 and the P⁺-type buried diffusion layer 2 is increased as shown in FIG. 13B, the intensity of the internal electric field generated from the P⁺-type buried diffusion layer 2 toward the high resistivity P-type epitaxial layer 3 is increased. Therefore, the mobility of the photocarrier generated between a region below the depletion layer at the interface between the high resistivity P-type epitaxial layer 3 and the N-type epitaxial layer 4, and a region nearer the surface of the photodiode than the region having the peak of the impurity concentration of the P⁺-type buried diffusion layer 2, is increased. Therefore, the response speed of the photodiode can be improved, even when the information recording side of an optical disk is irradiated with a large amount of light in order to reduce the write time of data to the information recording side of the optical disk, so that a large amount of reflected light enters the photodiode.

Further, even when the information recording side of an optical disk is irradiated with a large amount of light in order to reduce the write time of data to the information recording side of the optical disk, so that a large amount of reflected light enters the photodiode, the thickness of the high resistivity P-type epitaxial layer 3 may be reduced by a predetermined value, and the width of the depletion layer may be limited so as to increase the intensity of the electric field within the depletion layer in order to suppress a reduction in the response speed of the photodiode, due to the accumulation of electronic charge in the vicinity of the depletion layer at the interface between the high resistivity P-type epitaxial layer 3 and the N-type epitaxial layer 4. Thereby, the response speed of the photodiode can be improved.

Typically, in a write mode in which data is written into the information recording side of an optical disk, writing of data, and reading of an address signal for verifying whether or not the written data is accurately recorded at a predetermined position on the information recording side, are alternately performed.

In the write mode of the optical disk apparatus, the writing of data is carried out by irradiating the information recording side of an optical disk with high-power laser light. In the mode of reading an address signal, the information recording side of an optical disk is irradiated with laser light having constant power much lower than the power of the laser light used for the writing of data. The laser light is reflected from the optical disk, and ⅔₁₀₀th or less of the reflected light in the write mode is detected by the photodiode.

The photodiode has to reliably detect photocarriers generated by the reflected light of a very small power of laser light when reading an address signal in the write mode. To satisfy such a requirement, the photocarriers generated by the reflected light of the high-power laser light are collected as photoelectric current at high speed when writing data, and an excess portion of the photocarriers (carriers having a long movement time) are subjected to recombination so as to prevent the excess photocarriers from contributing to the photoelectric current (signal). Thereby, subsequent reading of the address signal can be rapidly carried out.

However, the speed of writing data by an optical disk apparatus onto an optical disk is being further increased and the light power of laser light in writing data is also being increased. As the light amount of laser light is increased, the photodiode is likely to fail to read an address signal immediately after writing data onto the optical disk in the write mode.

The inventors have analyzed this phenomenon using simulation. As a result, it was found that when writing data onto an optical disk, a portion of photocarriers generated in a region of the semiconductor layer of the photodiode deeper than the PN junction region are moved and reach the PN junction region, and are detected as a photoelectric current, i.e., the movement time of the photocarrier is elongated to such a level. When the level of a signal (photoelectric current) generated by the photocarrier having a long movement time is greater than or equal to a predetermined level compared to the level of the address signal, the signal generated by the photocarrier having a long movement time is superposed with the address signal, so that a photoelectric current representing the address signal may not be read out.

Hereinafter, a mechanism underlying the case when the photoelectric current representing an address signal cannot be read out in the photodiode (FIGS. 13A and 13B) in the write mode, will be described.

FIG. 14 is a graph showing the response characteristics of the photodiode shown in FIGS. 13A and 13B with respect to pulsed laser light (wavelength: $\lambda$=780 nm). This graph shows a change over time in photoelectric current (output current) generated by taking, into an external circuit, photocarriers generated in each region within the photodiode by reflected light of the high-power pulsed laser light when writing data in the write mode of the optical disk apparatus.

The upper portion of the graph in FIG. 14 shows the semiconductor layers of FIG. 13B, where region B indicates the N-type epitaxial layer 4, region C indicates the high resistivity P-type epitaxial layer 3, region D indicates a slant region of the P⁺-type buried diffusion layer 2 nearer the high resistivity P-type epitaxial layer 3, region E indicates a region of the P⁺-type buried diffusion layer 2 in the vicinity of the peak of the impurity concentration and nearer the high resistivity P-type epitaxial layer 3, and region F indicates a region of the P⁺-type buried diffusion layer 2 from the vicinity of the peak of the impurity concentration to the low resistivity P-type semiconductor substrate 1.

A solid line indicated by A in FIG. 14 shows the response speed of overall photocarriers, indicating that photocarriers generated by the reflected light of high-power laser light are taken as a photoelectric current into an external circuit, and it takes about 14 nsec for the photoelectric current of the photocarriers to decrease by a factor of ⅔₁₀₀th or less which can be read out as an address signal.

The photocarriers generated in the regions within the photodiode due to the reflected light of the high-power pulsed laser light entering the photodiode can be divided into four components below:

(i) a photocarrier component which is generated in the depletion layer provided at the interface between the N-type epitaxial layer 4 and the high resistivity P-type epitaxial layer 3 and is moved at high speed due to the electric field in the depletion layer (photocarriers generated in region B and region C);

(ii) a photocarrier component which is generated outside the depletion layer at the interface between the N-type epitaxial layer 4 and the high resistivity P-type epitaxial layer 3 and is moved due to the internal electric field of the P⁺-type buried diffusion layer 2 (photocarrier in region D);

(iii) photocarrier component which is generated at the region in the vicinity of the peak of the impurity concentration in the P⁺-type buried diffusion layer 2 and is moved by diffusion due to the concentration difference (photocarriers generated in region E); and (iv) a photocarrier component which is generated in a deeper region of the P⁺-type buried diffusion layer 2 between the region in the vicinity of the peak of the impurity concentration and the low resistivity P-type semiconductor substrate 7, and is substantially extinguished by recombination and slightly contributes to the photoelectric current (photocarriers generated in region F).

Among the photocarrier components (1) to (4), the photocarrier component (i) has the highest response speed, the photocarrier component (ii) has the second highest response speed, the photocarrier component (iii) has the third highest response speed. The photocarrier component (iv) is substantially extinguished by recombination and only slightly contributes to the photoelectric current, and has the lowest response speed.

The most of the photocarrier component (i) is taken as a photoelectric current to an external circuit within about 5 nsec. The most of the photocarrier component (ii) is taken as a photoelectric current to an external circuit within about 26 nsec. The most of the photocarrier component (iii) is taken as a photoelectric current to an external circuit within about 28 nsec. A relatively large portion of the photocarrier component (iv) is not taken as a photoelectric current to an external circuit even after 30 nsec.

FIG. 15 is a graph showing a change in light intensity from the surface of the photodiode in the depth direction when the reflected light of high-power pulsed laser light (wavelength: λ=780 nm) enters the photodiode shown in FIGS. 13A and 13B. The light intensity is exponentially decreased from the surface of the photodiode in the depth direction. For example, when the distance from the surface of the photodiode to the peak of the impurity concentration in the P⁺-type buried diffusion layer 2 is 17 μm, the light intensity in the vicinity of the interface between region E and region F is reduced to 13% of the light intensity at the surface of the photodiode.

The absolute numbers of photocarriers generated in the surface and the regions of the photodiode are proportional to the light intensity of the respective regions. Therefore, 80% or more of the total photocarriers are generated in regions B, C, and D.

The photocarrier components (iii) and (iv) are generated in regions E and F, respectively. Both regions E and F are deeper from the surface of the photodiode than the depletion layer, so that the absolute number of generated photocarriers is small. Therefore, in the data read mode of a typical optical disk apparatus, the photocarrier components (iii) and (iv) have substantially no influence on the level of an address signal when reading the address signal.

In contrast, in the data write mode of the optical disk apparatus, the amount of reflected light entering the photodiode from an optical disk is large in writing data, so that the absolute numbers of the photocarrier components (iii) generated in region E and (iv) generated in region F are increased.

When reading an address signal immediately after writing data, a light signal detected by the photodiode has a small power which is 2/100th or less of the reflected light from an optical disk when writing data. Therefore, when reading an address signal immediately after writing data, the photocarrier components (iii) generated in region E, and (iv) generated in region F, are increased in writing data. Therefore, the level of a photoelectric current generated by these photocarriers having a low response speed is greater than or equal to a predetermined level immediately after the writing of data as compared to the level of a photocarrier generated by an address signal, and the photoelectric current having a low response speed is superposed to the photoelectric current generated by the address signal, so that a photoelectric current representing the address signal may not be detected.

Such a phenomenon is likely to occur when writing of data is performed at high speed in the data write mode of an optical disk apparatus and pulsed laser light having a high power and a large amount is used. This is a large problem when a higher data write speed is desired.

SUMMARY OF THE INVENTION

According to an aspect of the present invention, a light receiving element comprises a semiconductor structure comprising at least a first conductivity type semiconductor layer, a first, second conductivity type semiconductor layer provided on the first conductivity type semiconductor layer in the semiconductor structure, a second, second conductivity type semiconductor layer having an impurity concentration lower than that of the first, second conductivity type semiconductor layer, a second, first conductivity type semiconductor layer provided on the second, second conductivity type semiconductor layer, or a second, first conductivity type semiconductor layer provided within the second, second conductivity type semiconductor layer.

In one embodiment of this invention, the semiconductor structure is a first conductivity type semiconductor substrate.

In one embodiment of this invention, the semiconductor structure further comprises a second conductivity type semiconductor substrate, and the second conductivity type semiconductor substrate is provided on the first conductivity type semiconductor layer.

In one embodiment of this invention, the semiconductor structure further comprises a first conductivity type semiconductor substrate, and the first conductivity type semiconductor substrate is provided on the first conductivity type semiconductor layer.

In one embodiment of this invention, an impurity element contained in the first conductivity type semiconductor substrate is antimony (Sb).

In one embodiment of this invention, an impurity element contained in the first conductivity type semiconductor layer is antimony (Sb).

In one embodiment of this invention, an impurity element contained in the first, second conductivity type semiconductor layer is boron (B).

In one embodiment of this invention, the first, second conductivity type semiconductor layer has an impurity concentration of $1\times10^{16}$ to $2\times10^{18}/cm^3$.

In one embodiment of this invention, the thickness of the first conductivity type semiconductor layer is smaller than or equal to 7 μm.

In one embodiment of this invention, the total thickness (d) of the second, first conductivity type semiconductor layer and the second, second conductivity type semiconductor layer is designed to satisfy the following expression:

$$EXP(-Gd) < 0.02$$

where G represents the absorption coefficient of incident light.

In one embodiment of this invention, the thickness of the second, second conductivity type semiconductor layer is designed such that the intensity of an electric field generated in a PN junction region at an interface between the second, second conductivity type semiconductor layer and the second, first conductivity type semiconductor layer, when applying a reverse bias voltage to the PN junction region, is greater than or equal to 0.3 V/$\mu$m.

In one embodiment of this invention, the first conductivity type semiconductor layer is an epitaxial growth layer.

In one embodiment of this invention, the second, first conductivity type semiconductor layer is an epitaxial growth layer.

In one embodiment of this invention, the second, first conductivity type semiconductor layer is provided by a thermal diffusion method.

In one embodiment of this invention, the first, second conductivity type semiconductor layer is an epitaxial growth layer.

In one embodiment of this invention, the impurity concentration of the first conductivity type semiconductor substrate is designed to be higher than an impurity concentration such that the impurity is diffused from the first, second conductivity type semiconductor layer and reaches the first conductivity type semiconductor substrate.

In one embodiment of this invention, the resistivity of the first conductivity type semiconductor substrate is smaller than or equal to 0.5 $\Omega$cm.

In one embodiment of this invention, the impurity concentration of the first, second conductivity type semiconductor layer is designed to be lower than the impurity concentration of the first conductivity type semiconductor layer in the semiconductor structure.

In one embodiment of this invention, the intensity of an internal electric field in a region in the vicinity of the peak of the impurity concentration of the first, second conductivity type semiconductor layer is increased.

In one embodiment of this invention, the first, second conductivity type semiconductor layer and the first conductivity type semiconductor layer of the semiconductor structure are shorted at an end face of a chip.

In one embodiment of this invention, the junction area of a PN junction region at an interface between the first, second conductivity type semiconductor layer and the first conductivity type semiconductor layer of the semiconductor structure is greater than or equal to 0.25 mm$^2$.

In one embodiment of this invention, the first, second conductivity type semiconductor layer and the first conductivity type semiconductor layer in the semiconductor structure are shorted with an external line.

In one embodiment of this invention, the first conductivity type semiconductor substrate of the semiconductor structure is connected to a high potential with an external line.

According to another aspect of the present invention, a light detector with built-in circuitry, comprises the above-described light receiving element and a signal processing circuit for processing a signal detected by the light receiving element. The light receiving element and the signal processing circuit are provided on the same substrate.

In one embodiment of this invention, the first conductivity type semiconductor layer of the semiconductor structure provided in the light receiving element, is not disposed at least in a region in which the signal processing circuit is provided.

According to another aspect of the present invention, an optical pickup comprises the above-described light receiving element or the above-described light detector with built-in circuitry.

In one embodiment of this invention, a frame carrying the light receiving element is connected to the ground (GND).

Functions of the present invention will be described.

In the light receiving element of the present invention, light entering the light receiving surface of the light receiving element (the surface of the second, first conductivity type semiconductor layer) generates photocarriers at the first conductivity type semiconductor substrate located deeper than the first, second conductivity type semiconductor layer; when the photocarriers are moved to the PN junction region at the interface between the first, second conductivity type semiconductor layer and the first conductivity type semiconductor substrate, most of the photocarriers are taken into the depletion layer due to the strong electric field and are subjected to recombination and are extinguished. Therefore, the photocarriers generated in the first conductivity type semiconductor substrate do not reach the PN junction region between the second, first conductivity type semiconductor layer and the second, second conductivity type semiconductor layer, having substantially no contribution to a photoelectric current. Further, photocarriers generated in a narrow region in the vicinity of the peak of the impurity concentration of the first, second conductivity type semiconductor layer are moved in two directions, i.e., toward the PN junction region at the interface between the first, second conductivity type semiconductor layer and the first conductivity type semiconductor substrate (photocarrier $\alpha$) and toward the second, second conductivity type semiconductor layer (photocarrier $\beta$).

The photocarrier $\alpha$ (electron) is moved toward the first conductivity type semiconductor substrate, having substantially no contribution to the photoelectric current. The photocarrier $\beta$ is moved at high speed up to the depletion layer at the interface between the second, first conductivity type semiconductor layer and the second, second conductivity type semiconductor layer due to the strong internal electric field in the portion of the first, second conductivity type semiconductor layer nearer the second, second conductivity type semiconductor layer.

Thus, the number of photocarriers having a low response speed, which are generated at a site deeper than the narrow region in the vicinity of the peak of the impurity concentration of the first, second conductivity type semiconductor layer within the light receiving element, and are moved over a long distance to an end of the depletion layer (PN junction region) provided at the interface between the second, second conductivity type semiconductor layer and the second, first conductivity type semiconductor layer, can be reduced. Further, the region in the vicinity of the peak of the impurity concentration of the first, second conductivity type semiconductor layer is narrow, and the intensity of the internal electric field in this region is increased. Therefore, photocarriers generated in a portion of the narrow region in the vicinity of the peak of the impurity concentration of the first, second conductivity type semiconductor layer and nearer the second, second conductivity type semiconductor layer can be reliably moved to the depletion layer at the interface between the second, first conductivity type semiconductor layer and the second, second conductivity type semiconductor layer and can be taken as a photoelectric current. As a result, a delayed photoelectric current due to the photocarriers having a long movement time and a low response speed can be substantially reduced, thereby obtaining the photodiode having a much improved response speed with respect to incident light.

Thus, the invention described herein makes possible the advantages of providing a light receiving element capable of writing data onto an optical disk at high speed in the data write mode of an optical disk apparatus by reducing photocarriers generated in a region deeper than a depletion layer and having a low response time required to be moved to the vicinity of the depletion layer; an light detector with built-in circuitry comprising the light receiving element; and an optical pickup comprising these devices.

BRIEF DESCRIPTION OF THE DRAWINGS

FIG. 1A is a cross-sectional view showing a light receiving element (photodiode) according to Example 1 of the present invention of the present invention.

FIG. 1B is a graph showing the impurity concentration on a cross section of the photodiode, taken along line X–X' in FIG. 1A.

FIG. 2A is a graph showing the behavior of a photocarrier generated within the photodiode of the present invention.

FIG. 2B is a graph showing the behavior of a photocarrier generated within a conventional photodiode.

FIG. 4A is a cross-sectional view showing a structure of a light receiving element (photodiode) according to Example 2 of the present invention.

FIG. 4B is a graph showing the impurity concentration on a cross section of the photodiode, taken along line Y–Y' in FIG. 4A.

FIG. 5A is a cross-sectional view showing a structure of a light receiving element (photodiode) according to Example 3 of the present invention.

FIG. 5B is a graph showing the impurity concentration on a cross section of the photodiode, taken along line Z–Z' in FIG. 5A.

FIG. 13A is a cross-sectional view showing a conventional photodiode.

FIG. 13B is a graph showing the impurity concentration distribution of a cross section of the photodiode taken along line W–W' in FIG. 13A.

DESCRIPTION OF THE PREFERRED EMBODIMENTS

Figure 3:
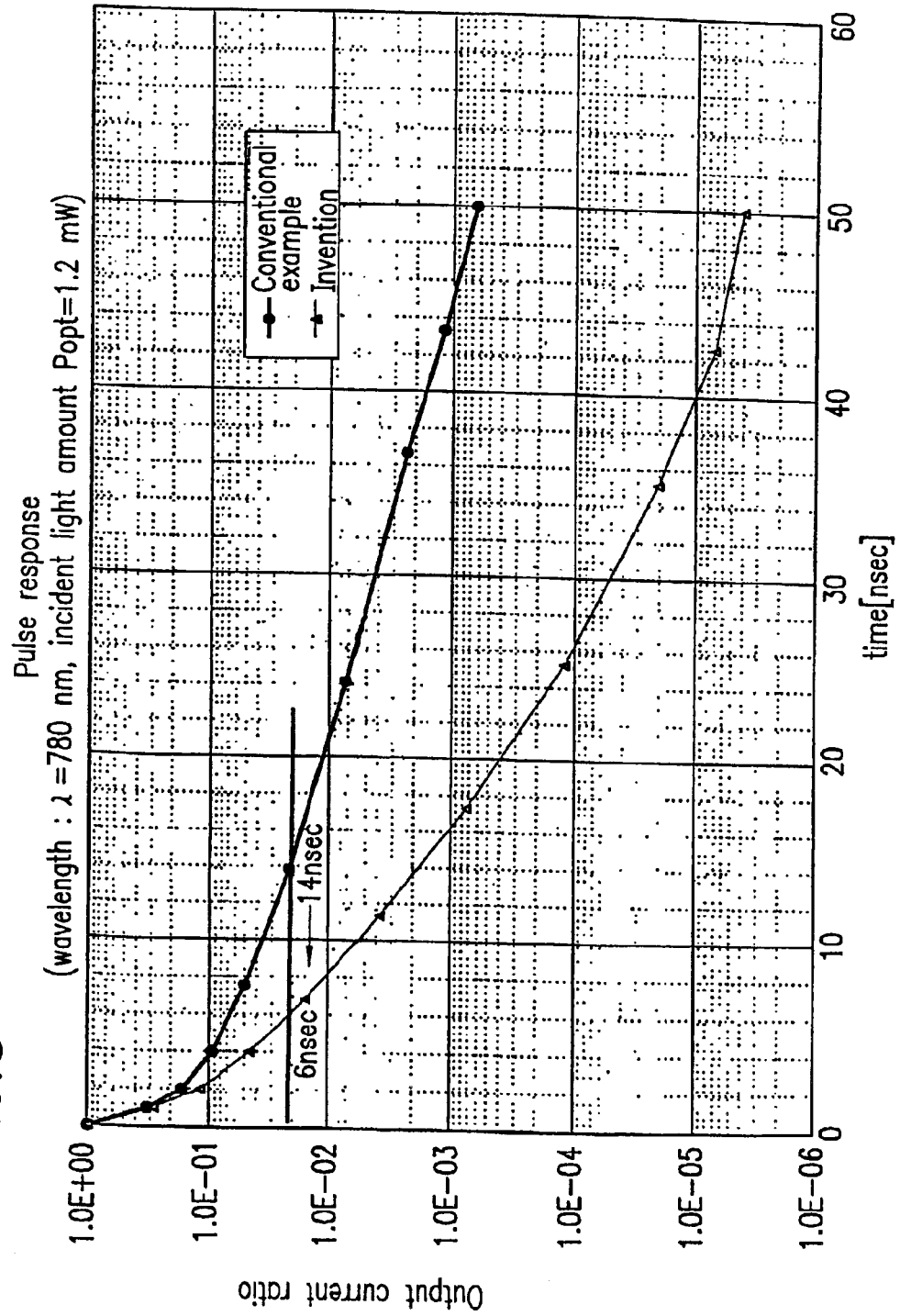
FIG. 3 is a graph showing the response characteristics of the photodiode of the present invention and a conventional photodiode with respect to pulsed laser light.

Hereinafter, the present invention will be described by way of examples with reference to the accompanying drawings.

EXAMPLE 1

FIG. 1A is a cross-sectional view showing a light receiving element (photodiode) according to Example 1 of the present invention. FIG. 1B is a graph showing the impurity concentration on a cross section of the photodiode, taken along line X–X' in FIG. 1A. Note that in FIG. 1A, an anode electrode, a cathode electrode, signal lines and a surface protection film are not shown.

The photodiode of FIG. 1A comprises an $N^+$-type semiconductor substrate 1 (first conductivity type semiconductor substrate) having a high impurity concentration, and a $P^+$-type buried diffusion layer 2 (first, second conductivity type semiconductor layer) having a lower impurity concentration than that of the substrate 1, a high resistivity P-type epitaxial layer 3 (second, second conductivity type semiconductor layer) having a lower impurity concentration than that of the $P^+$-type buried diffusion layer 2, and an N-type epitaxial layer 4 (second, first conductivity type semiconductor layer),which are laminated in this order on the substrate 1. Thus, the photodiode has a multilayer structure. A plurality of $P^+$-type separation buried diffusion layers 12 are provided in predetermined regions at an interface between the high resistivity P-type epitaxial layer 3 and the N-type epitaxial layer 4. A $P^+$-type separation buried diffusion layer 11 is provided on each $P^+$-type separation buried diffusion layer 12 within the N-type epitaxial layer 4. A surface of the $P^+$-type separation buried diffusion layer 11 is exposed from a surface of the N-type epitaxial layer 4. Thus, the photodiode shown in FIG. 1A is provided in a region surrounded by the $P^+$-type separation buried diffusion layer 12 and the $P^+$-type separation buried diffusion layer 11 on the high resistivity P-type epitaxial layer 3. In the photodiode shown in FIG. 1A, a PN junction region is provided at an interface between the N-type epitaxial layer 4 and the high resistivity P-type epitaxial layer 3 and between the $P^+$-type buried diffusion layer 2 and the $N^+$-type semiconductor substrate 1.

An N-type semiconductor layer corresponding to the N-type epitaxial layer 4 may be an N-type diffusion layer such that a surface of the N-type semiconductor layer is exposed at a thermal diffusion region that is buried in the high resistivity P-type epitaxial layer 3 from a surface of the high resistivity P-type epitaxial layer 3.

The impurity concentration distribution of the photodiode shown in FIG. 1A from the surface to the inside is shown in FIG. 1B.

A strong electric field is generated in a PN junction region at the interface between the N-type epitaxial layer 4 and the high resistivity P-type epitaxial layer 3 by applying a reverse bias voltage to the PN junction.

The impurity concentration of the high resistivity P-type epitaxial layer 3 is designed to be lower than the impurity concentration of the N-type epitaxial layer 4, except for the PN junction region.

The impurity concentration of the $P^+$-type buried diffusion layer 2 is designed to be higher than the impurity concentration of the high resistivity P-type epitaxial layer 3, and to have a curved profile with a peak of the impurity concentration. Therefore, a portion of the $P^+$-type buried diffusion layer 2 between a region having the peak of the impurity concentration and the high resistivity P-type epitaxial layer 3, has a higher potential than that of the high resistivity P-type epitaxial layer 3. As a result, an internal electric field is generated in the $P^+$-type buried diffusion layer 2 from the region having the peak of the impurity concentration toward the high resistivity P-type epitaxial layer 3.

In the PN junction region at the interface between the $P^+$-type buried diffusion layer 2 and the $N^+$-type semiconductor substrate 1, the impurity concentrations of the $P^+$-type buried diffusion layer 2 and the $N^+$-type semiconductor substrate 1 are compensated by each other, and both impurity concentrations are steeply reduced. Therefore, a strong electric field is generated in the PN junction region from the $P^+$-type buried diffusion layer 2 and the $N^+$-type semiconductor substrate 1 toward the junction interface. Further, the junction interface of the PN junction region is provided in a region in the vicinity of the peak of the impurity concentration in the $P^+$-type buried diffusion layer 2. Therefore, the region in the vicinity of the peak of the impurity concentration in the $P^+$-type buried diffusion layer 2 is narrow, and the intensity of the internal electric field is increased in the region.

The impurity concentration of the $N^+$-type semiconductor substrate 1 is designed to be higher than the peak of the impurity concentration of the $P^+$-type buried diffusion layer 2, and to be uniformly and flatly distributed. Since the impurity concentration of the $N^+$-type semiconductor substrate 1 is designed to be higher than the peak of the impurity concentration of the $P^+$-type buried diffusion layer 2, the PN junction region at the interface between the $P^+$-type buried diffusion layer 2 and the $N^+$-type semiconductor substrate 1 can be provided in the vicinity of the peak of the impurity concentration of the $P^+$-type buried diffusion layer 2.

In the thus-constructed photodiode of the present invention, light entering the light receiving surface (N-type epitaxial layer 4) of the photodiode generates photocarriers at the $N^+$-type semiconductor substrate 1 located deeper than the $P^+$-type buried diffusion layer 2; when the photocarriers are moved to the PN junction region at the interface between the $P^+$-type buried diffusion layer 2 and the $N^+$-type semiconductor substrate 1, most of the photocarriers are taken into the depletion layer in the PN junction region due to the strong electric field and are subjected to recombination and are extinguished. Therefore, the photocarriers generated in the $N^+$-type semiconductor substrate 1 do not reach the PN junction region between the N-type epitaxial layer 4 and the high resistivity P-type epitaxial layer 3, having substantially no contribution to a photoelectric current. Further, photocarriers generated in a narrow region in the vicinity of the peak of the impurity concentration of the $P^+$-type buried diffusion layer 2 are moved in two directions, i.e., toward the PN junction region at the interface between the $P^+$-type buried diffusion layer 2 and the $N^+$-type semiconductor substrate 1 (photocarrier α) and toward the high resistivity P-type epitaxial layer 3 (photocarrier β).

The photocarrier α (electron) is moved toward the $N^+$-type semiconductor substrate 1, having substantially no contribution to the photoelectric current.

The photocarrier β is moved at high speed up to the depletion layer at the interface between the N-type epitaxial layer 4 and the high resistivity P-type epitaxial layer 3 due to the strong internal electric field in the portion of the $P^+$-type buried diffusion layer 2 nearer the high resistivity P-type epitaxial layer 3.

Thus, in the photodiode according to Example 1 of the present invention shown in FIGS. 1A and 1B, the number of photocarriers having a low response speed, which are generated at a site deeper than the narrow region in the vicinity of the peak of the impurity concentration of the $P^+$-type buried diffusion layer 2 within the photodiode, and are moved over a long distance to an end of the depletion layer (PN junction region) provided at the interface between the high resistivity P-type epitaxial layer 3 and the N-type epitaxial layer 4, can be reduced. Further, the region in the vicinity of the peak of the impurity concentration of the $P^+$-type buried diffusion layer 2 is narrow, and the intensity of the internal electric field in this region is-increased. Therefore, photocarriers generated in a portion of the narrow region in the vicinity of the peak of the impurity concentration of the $P^+$-type buried diffusion layer 2 and nearer the high resistivity P-type epitaxial layer 3 can be reliably moved to the depletion layer at the interface between the N-type epitaxial layer 4 and the high resistivity P-type epitaxial layer 3, and can be taken as a photoelectric current. As a result, a delayed photoelectric current due to the photocarriers having a long movement time and a low response speed can be substantially reduced, thereby obtaining the photodiode having a much improved response speed with respect to incident light.

A method for producing the photodiode shown in FIG. 1A will be briefly described below.

Initially, on an impurity concentration $N^+$-type semiconductor substrate 1 having an N-type impurity concentration of $1\times10^{18}/cm^3$ or more, a $P^+$-type buried diffusion layer 2 is formed by diffusion of high concentration P-type impurity of about $1\times10^{17}/cm^3$, for example. Thereafter, a high resistivity P-type epitaxial layer 3 having a low impurity concentration is formed on the $P^+$-type buried diffusion layer 2 by an epitaxial growth method. Thereafter, a $P^+$-type separation buried diffusion layer 12 is formed on the high resistivity P-type epitaxial layer 3, followed by formation of the N-type epitaxial layer 4 (by an epitaxial growth method) and the $P^+$-type separation buried diffusion layer 11. The $P^+$-type separation buried diffusion layer 11 is caused to contact the $P^+$-type separation buried diffusion layer 12 from a surface of the N-type epitaxial layer 4.

Thus, on the $N^+$-type semiconductor substrate 1, a photodiode as shown in FIG. 1A is electrically separated from peripheral circuitry by the $P^+$-type separation buried diffusion layers 11 and 12. Further, a signal processing circuit for processing a signal detected in the photodiode of FIG. 1A may be provided in the peripheral circuitry on the $N^+$-type semiconductor substrate 1. Alternatively, an N-type diffusion layer may be provided on the high resistivity P-type epitaxial layer 3 disclosed in Japanese Laid-Open Publication No. 10-107243 by diffusion of an N-type impurity.

Figure 9:
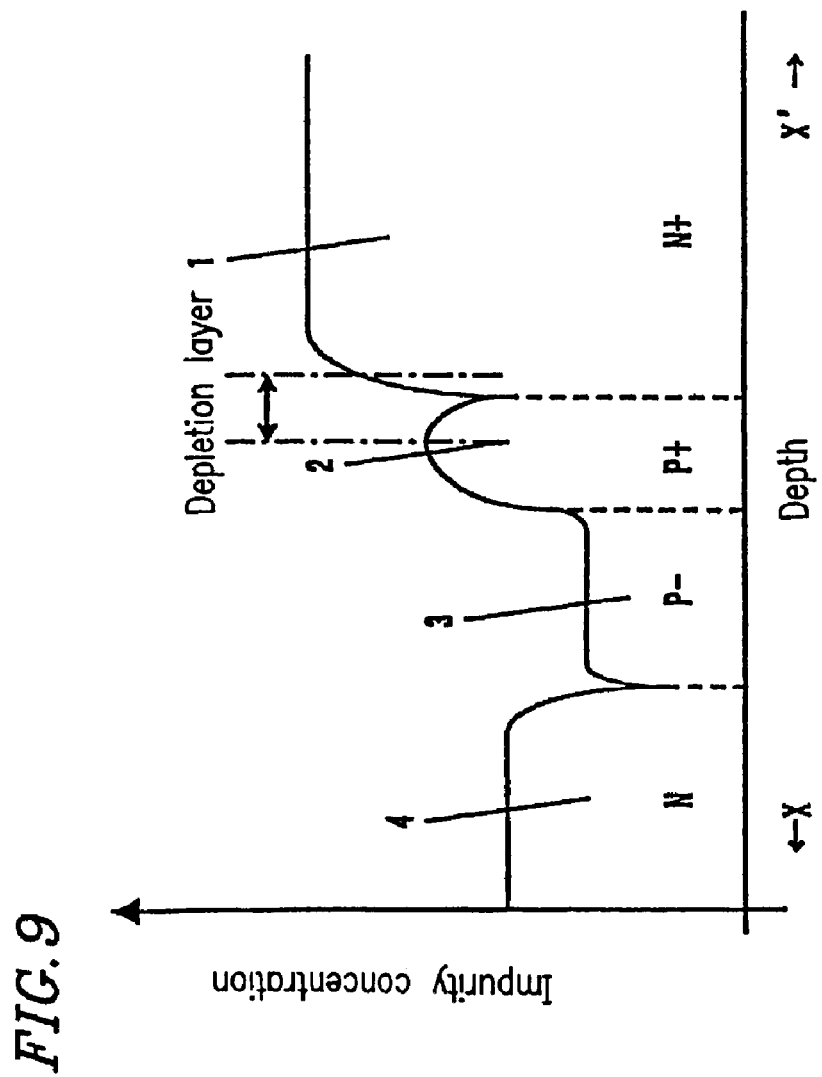
FIG. 9 is a graph showing a cross-sectional structure of the photodiode according to Example 1 of the present invention, indicating the relationship in impurity concentration distribution between an $N^+$-type semiconductor substrate and a $P^+$-type buried diffusion layer.

In this case, the $N^+$-type semiconductor substrate 1 is preferably designed to have an impurity concentration higher than the impurity concentration of the $P^+$-type buried diffusion layer 2. FIG. 9 is a graph showing a cross-sectional structure of the photodiode according to Example 1 of the present invention, indicating the relationship in impurity concentration distribution between the $N^+$-type semiconductor substrate 1 and the $P^+$-type buried diffusion layer 2. With such a structure, the photodiode of the present invention can provide a PN junction region in a region closer to the peak of the impurity concentration of the P$^+$-type buried diffusion layer 2, whereby the region in the vicinity of the peak of the impurity concentration of the P$^+$-type buried diffusion layer 2 can be further narrowed. Therefore, the photocarriers generated in the region in the vicinity of the peak of the impurity concentration of the P$^+$-type buried diffusion layer 2 can be easily separated into the above-described photocarrier α and the photocarrier β. Only the photocarrier β can be moved at high speed by the internal electric field due to the impurity concentration distribution of the portion of the P$^+$-type buried diffusion layer 2 nearer the high resistivity P-type epitaxial layer 3.

Figure 10:
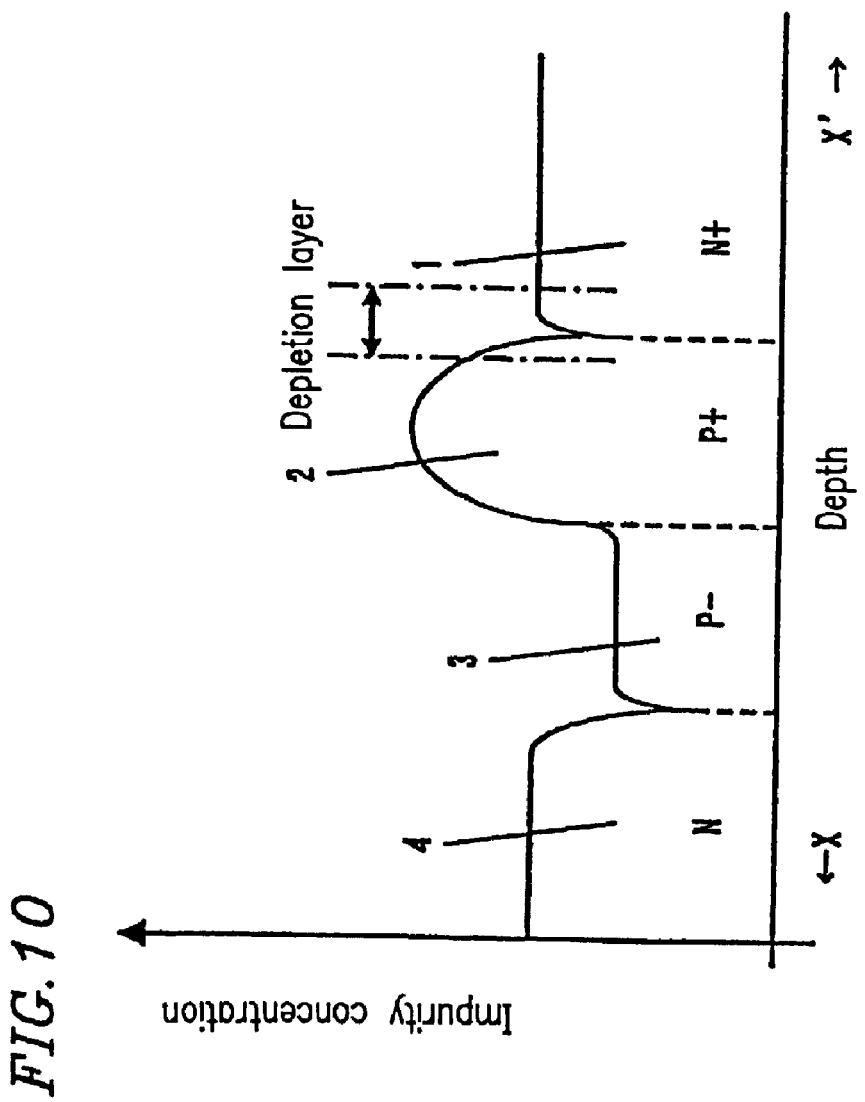
FIG. 10 is a graph showing the relationship in the impurity concentration distribution when the impurity concentration of an $N^+$-type semiconductor substrate in FIG. 9 is not sufficiently high as compared to the impurity concentration of a $P^+$-type buried diffusion layer.

The impurity concentration of the P$^+$-type buried diffusion layer 2 is preferably about $1\times10^{16}$ to $1\times10^{18}/cm^3$. FIG. 10 is a graph showing the relationship in the impurity concentration distribution when the impurity concentration of the N$^+$-type semiconductor substrate 1 in FIG. 9 is not sufficiently high as compared to the impurity concentration of the P$^+$-type buried diffusion layer 2. When the impurity concentration of the P$^+$-type buried diffusion layer 2 is higher than $2\times10^{18}/cm^3$, as shown in FIG. 10, the depletion layer in the PN junction region generated at the interface between the P$^+$-type buried diffusion layer 2 and the N$^+$-type semiconductor substrate 1, is located away from the peak of the impurity concentration of the P$^+$-type buried diffusion layer 2. Therefore, a portion of the photocarriers generated in the region in the vicinity of the peak of the impurity concentration of the P$^+$-type buried diffusion layer 2, are not taken into the depletion layer in the PN junction region generated at the interface between the P$^+$-type buried diffusion layer 2 and the N$^+$-type semiconductor substrate 1 and not recombined, and are moved up to the depletion layer in the PN junction region at the interface between the N-type epitaxial layer 4 and the high resistivity P-type epitaxial layer 3, and are taken into the depletion layer, whereby the effect of improving the response speed is reduced. Therefore, in order to move the photocarriers at high speed so that the effect of improving the response speed of the photocarriers is sufficiently achieved, the impurity concentration of the N$^+$-type semiconductor substrate 1 is preferably higher than the impurity concentration of the P$^+$-type buried diffusion layer 2 by one to two orders of magnitude. In contrast, when the impurity concentration of the P$^+$-type buried diffusion layer 2 is lower than $1\times10^{16}/cm^3$, the anode resistance of the photodiode is increased and the data read rate is decreased.

The N-type impurity in the N$^+$-type semiconductor substrate 1 is preferably antimony (Sb). When the N-type impurity is antimony (Sb) which has a small coefficient of diffusion, the impurity concentration distribution profile of a N$^+$-type semiconductor substrate 1 portion of the PN junction region at the interface between the P$^+$-type buried diffusion layer 2 and the N$^+$-type semiconductor substrate 1 can be made steep. Therefore, the intensity of the internal electric field based on the impurity concentration distribution in the N$^+$-type semiconductor substrate 1 portion is much higher, and photocarriers generated in a deep region in the N$^+$-type semiconductor substrate 1 portion, which have a long movement time and a low response speed, do not reach the junction between the high resistive p-type epitaxial layer 3 and the N-type epitaxial layer 4 due to the potential barrier (i.e., the PN junction at the interface between the P$^+$-type buried diffusion layer 2 and the N$^+$-type semiconductor substrate 1).

The P-type impurity of the P$^+$-type buried diffusion layer 2 is preferably boron(B). When the P-type impurity is boron (B) which has a relatively large coefficient of diffusion, a predetermined amount of boron (B) can be added to a predetermined region on the N$^+$-type semiconductor substrate 1. Thereafter, when the high resistivity P-type epitaxial layer 3 is formed by an epitaxial growth method, a greater amount of boron (B) than the amount of the N-type impurity antimony (Sb) is diffused into the epitaxial growth layer, thereby obtaining a predetermined structure.

The slope of the impurity concentration distribution profile of the portion of the P$^+$-type buried diffusion layer 2 nearer the high resistivity P-type epitaxial layer 3 is preferably steep, and therefore, is preferably formed by an epitaxial growth method.

When the amount of light entering the photodiode is relatively low (e.g., about several hundreds of μW), the total thickness (d) of the high resistivity P-type epitaxial layer 3 and the N-type epitaxial layer 4 is preferably designed in such a manner as to satisfy the following expression (1):

$$\text{EXP}(-Gd) < 0.02 \tag{1}$$

where G represents the absorption coefficient of incident light.

The reason will be described below. In general, the intensity of light entering a semiconductor at a depth x is represented by the following expression:

$$I(x) = I_0 \text{EXP}(-Gx).$$

Since a position at the distance d from the surface of the photodiode substantially corresponds to the peak of the impurity concentration of the P$^+$-type buried diffusion layer 2, if the total thickness (d) of the high resistivity P-type epitaxial layer 3 and the N-type epitaxial layer 4 is designed to satisfy the expression (1), the intensity of incident light is attenuated by a factor of 2/100th when reaching the vicinity of the peak of the impurity concentration of the P$^+$-type buried diffusion layer 2. Therefore, if photocarriers leak from the depletion layer in the PN junction region at the interface between the N$^+$-type semiconductor substrate 1 and the P$^+$-type buried diffusion layer 2 and reach the depletion layer in the PN junction region at the interface between the high resistivity P-type epitaxial layer 3 and the N-type epitaxial layer 4, the photoelectric current is sufficiently small that it does not have an influence on the level of an address signal. Therefore, all photocarriers contributing to a response are generated in the portion of the P$^+$-type buried diffusion layer 2 nearer the high resistivity P-type epitaxial layer 3 having a strong internal electric field due to the impurity concentration distribution, whereby the photodiode of the present invention can provide a faster operation.

When the amount of incident light to the photodiode is relatively high (e.g., about several mW), and the wavelength of the incident light to the photodiode is 650 nm or 400 nm (short wavelength), the thickness of the high resistivity P-type epitaxial layer 3 is preferably designed so that the intensity of the electric field within the depletion layer in the PN junction region of the N-type epitaxial layer 4 is greater than or equal to 0.3 V/μm. This is because, as disclosed in Japanese Laid-Open Publication No. 2001-77401 (Publication 1), if the intensity of the electric field within the depletion layer is weak, the accumulation of photocarriers generated when the amount of incident light to the photodiode in writing data is increased causes the potential to be flat, leading to a reduction in the response performance of the photodiode.

Note that in the photodiode according to Example 1 of the present invention shown in FIG. 1A, the N-type epitaxial layer 4 is provided on the high resistivity P-type epitaxial layer 3. The same effect can be obtained even when the above-described N-type diffusion layer or the like is buried in the high resistivity P-type epitaxial layer 3.

FIGS. 2A and 2B are diagrams showing the behavior of a photocarrier in the photodiode of the present invention and a conventional photodiode, respectively, for comparison therebetween.

FIG. 2A shows the behavior of a photocarrier generated within the photodiode of the present invention. In the photodiode of the present invention, a PN junction region is provided in the region in the vicinity of the peak of the impurity concentration of the $P^+$-type buried diffusion layer 2, and the region in the vicinity of the peak of the impurity concentration of the $P^+$-type buried diffusion layer 2 is narrow, so that the intensity of the electric field in this region is increased. Therefore, the photocarriers, which are generated deep from the surface of the photodiode, i.e., the region from the vicinity of the peak of the impurity concentration of the $P^+$-type buried diffusion layer 2 to the $N^+$-type semiconductor substrate 1, are preventing from reaching the PN junction region at the interface between the N-type epitaxial layer 4 and the high resistivity P-type epitaxial layer 3 by the potential barrier present in the PN junction region at the interface between the $P^+$-type buried diffusion layer 2 and the $N^+$-type semiconductor substrate 1, and cannot contribute to a photoelectric current. The photocarriers, which are generated in the region from the vicinity of the peak of the impurity concentration of the $P^+$-type buried diffusion layer 2 to the high resistivity P-type epitaxial layer 3, are moved at high speed by an internal electric field to the depletion layer at the interface between the N-type epitaxial layer 4 and the high resistivity P-type epitaxial layer 3, and are taken as a photoelectric current into an external circuit. Thereby, substantially no photocarrier having a long movement time and a low response speed is present in the photodiode of the present invention.

FIG. 2B shows the behavior of a photocarrier generated within a conventional photodiode. The potential of the region in the vicinity of the peak of the impurity concentration of the $P^+$-type buried diffusion layer 2 functions as a potential barrier relative to the potential of the low resistivity P-type semiconductor substrate 7. However, the region in the vicinity of the peak of the impurity concentration of the $P^+$-type buried diffusion layer 2 is wider than the region in the vicinity of the peak of the impurity concentration of the $P^+$-type buried diffusion layer 2 in FIG. 2A. Therefore, the photocarriers generated in the region from the vicinity of the peak of the impurity concentration of the $P^+$-type buried diffusion layer 2 to the high resistivity P-type epitaxial layer 3, are moved at high speed by an internal electric field to the depletion layer at the interface between the N-type epitaxial layer 4 and the high resistivity P-type epitaxial layer 3, and are taken as a photoelectric current into an external circuit. A portion of the photocarriers generated in the region in the vicinity of the peak of the impurity concentration of the $P^+$-type buried diffusion layer 2, are moved through a region in which the photocarriers are not substantially influenced by the electric field and are only diffused, to the depletion layer at the interface between the N-type epitaxial layer 4 and the high resistivity P-type epitaxial layer 3. Another portion of the photocarriers are moved via a region, in which the photocarriers are moved by a weak internal electric field due to a small concentration gradient, to the depletion layer at the interface between the N-type epitaxial layer 4 and the high resistivity P-type epitaxial layer 3. Therefore, photocarriers having a long movement time and a low response speed are present.

Therefore, as in the photodiode of the present invention shown in FIG. 2A, the PN junction region is provided in the region in the vicinity of the peak of the impurity concentration of the $P^+$-type buried diffusion layer 2, and the region in the vicinity of the peak of the impurity concentration of the $P^+$-type buried diffusion layer 2 is narrow, thereby making it possible to significantly reduce a photocarrier having a long movement time and a low response speed.

FIG. 3 is a graph showing the response characteristics of the photodiode of the present invention and a conventional photodiode with respect to pulsed laser light (wavelength: $\lambda=780$ nm, light power Popt=1.2 mW).

This graph shows a change over time in photoelectric current (output current) generated by taking into an external circuit photocarriers generated within the photodiode by reflected light of high-power pulsed laser light when writing data in the write mode of an optical disk apparatus.

As shown in FIG. 3, in the conventional photodiode, photocarriers generated by the reflected light of high-power laser light are taken as a photoelectric current into an external circuit, and it takes about 14 nsec for the photoelectric current of the photocarriers to decrease by a factor of 2/100th or less at which level the photoelectric current can be read out as an address signal.

In contrast, it takes only 6 nsec in the photodiode of the present invention.

If the write rate in the write mode of the optical disk apparatus is increased by a factor of 40, for example, photocarriers generated by reflected light of high-power laser light are taken as a photoelectric current into an external circuit, and the time required for the photoelectric current of the generated photocarriers to be attenuated by a factor of 2/100th or less, at which level the photoelectric current can be read out as an address signal, has to be smaller than or equal to 10 nsec.

Therefore, according to the results shown in FIG. 3, the photodiode of the present invention can provide a considerably high response speed which meets the 40X write speed.

EXAMPLE 2

FIG. 4A is a cross-sectional view showing a structure of a light receiving element (photodiode) according to Example 2 of the present invention. FIG. 4B is a graph showing the impurity concentration on a cross section of the photodiode, taken along line Y–Y' in FIG. 4A. Note that in FIG. 4A, an anode electrode, a cathode electrode, signal lines and a surface protection film are not shown.

The photodiode shown in FIG. 4A comprises a semiconductor structure comprising a low resistivity P-type semiconductor substrate 7 (second conductivity type semiconductor layer), and an $N^{++}$-type buried diffusion layer 6 (first conductivity type semiconductor layer) thereon, which has a higher impurity concentration than that of the low resistivity P-type semiconductor substrate 7. On the $N^{++}$-type buried diffusion layer 6, a $P^+$-type buried diffusion layer 2 having a lower impurity concentration than that of the $N^{++}$-type buried diffusion layer 6, a high resistivity P-type epitaxial layer 3 having a lower impurity concentration than that of the $P^+$-type buried diffusion layer 2, and an N-type epitaxial layer 4 are laminated in this order. In other respects, the photodiode of FIG. 4A has a similar structure to that of the photodiode of FIG. 1A.

An N-type semiconductor layer corresponding to the N-type epitaxial layer 4 may be an N-type diffusion layer, such that a surface of the N-type semiconductor layer is exposed at a thermal diffusion region that is buried in the high resistivity P-type epitaxial layer 3 from a surface of the high resistivity P-type epitaxial layer 3.

The impurity concentration distribution of the photodiode shown in FIG. 4A, from the surface to the inside, is shown in FIG. 4B.

The impurity concentration distributions of the low resistivity P-type semiconductor substrate 7 and the $N^{++}$-type buried diffusion layer 6 are different from the impurity concentration distribution of the $N^+$-type semiconductor substrate 1 in FIG. 1B. In the other regions, the photodiode of FIG. 4A has a similar impurity concentration distribution to that in the photodiode of FIG. 1A.

Therefore, the photodiode of FIGS. 4A and 4B has the same effects of the photodiode of FIGS. 1A and 1B.

In the photodiode shown in FIG. 4A, on the low resistivity P-type semiconductor substrate 7 having a typical impurity concentration, the $N^{++}$-type buried diffusion layer 6 is formed by diffusing high concentration N-type impurity of $1 \times 10^{18}/cm^3$ or more, for example. Thereafter, on the $N^{++}$-type buried diffusion layer 6, the $P^+$-type buried diffusion layer 2 is formed by diffusing P-type impurity of $1 \times 10^{17}/cm^3$ or more. Thereafter, on the $P^+$-type buried diffusion layer 2, the high resistivity P-type epitaxial layer 3 having an impurity concentration of $1 \times 10^{14}/cm^3$ or less is formed by an epitaxial growth method. Thereafter, on the high resistivity P-type epitaxial layer 3, a $P^+$-type separation buried diffusion layer 12 is formed, followed by formation of the N-type epitaxial layer 4 (by an epitaxial growth method) and the $P^+$-type separation buried diffusion layer 11. The $P^+$-type separation buried diffusion layer 11 is formed so as to contact the $P^+$-type separation buried diffusion layer 12 from a surface of the N-type epitaxial layer 4.

Therefore, the $N^{++}$-type buried diffusion layer 6 is formed on the low resistivity P-type semiconductor substrate 7, and the photodiode of FIG. 4A is electrically separated from peripheral circuitry by the $P^+$-type separation buried diffusion layers 11 and 12.

In the photodiode shown in FIG. 4A, a PN junction region is provided at an interface between the $N^{++}$-type buried diffusion layer 6 and the $P^+$-type buried diffusion layer 2. Therefore, as in the photodiode shown in FIG. 1A, the number of photocarriers having a long movement time and a low response speed can be significantly reduced.

In the photodiode shown in FIG. 4A, a PN junction region is also provided at an interface between the low resistivity P-type semiconductor substrate 7 and the $N^{++}$-type buried diffusion layer 6. Therefore, photocarriers generated in a region deeper than the $N^{++}$-type buried diffusion layer 6 can be confined in the $N^{++}$-type buried diffusion layer 6 by a potential barrier, whereby the photocarriers are prevented from contributing to a photoelectric current, and the photocarriers having a long movement time and a low response speed can be further reduced.

The impurity concentration of the $N^{++}$-type buried diffusion layer 6 is preferably designed to be higher than the impurity concentration of the $P^+$-type buried diffusion layer 2.

The N-type impurity of the $N^{++}$-type buried diffusion layer 6 is preferably antimony (Sb).

The P-type impurity of the $P^+$-type buried diffusion layer 2 is preferably boron (B).

The slope of the impurity concentration distribution profile of the $N^{++}$-type buried diffusion layer 6 or the $P^+$-type buried diffusion layer 2 is preferably steep. To meet this requirement, an epitaxial growth method is preferably used.

The thickness (diffusion width) of the $N^{++}$-type buried diffusion layer 6 is preferably 7 μm or less. If the thickness of the $N^{++}$-type buried diffusion layer 6 is broadly expanded, the vicinity of the peak of the impurity concentration of the $P^+$-type buried diffusion layer 2 is not steep. In this case, photocarriers having a low response speed are not reduced. If the total amount of the impurity in the $N^{++}$-type buried diffusion layer 6 is the same, the smaller (shallower) the thickness (diffusion depth) of the $N^{++}$-type buried diffusion layer 6, the higher the peak of the impurity concentration in the impurity concentration distribution. This is an advantage in terms of production.

Since the photodiode shown in FIG. 4A employs the low resistivity P-type semiconductor substrate 7 having a lower impurity concentration than that of the $N^+$-type semiconductor substrate 1, it is not necessary to prevent auto-doping from the low resistivity P-type semiconductor substrate 7 to the surface of the photodiode, thereby making it easy to produce the photodiode.

Note that although in the photodiode according to Example 2 of the present invention shown in FIG. 4A, the N-type epitaxial layer 4 is provided on the high resistivity P-type epitaxial layer 3, an N-type diffusion layer or the like may be buried in the high resistivity P-type epitaxial layer 3 as disclosed in Japanese Laid-Open Publication No. 10-107243. In this case, the same effects are obtained.

Figure 11:
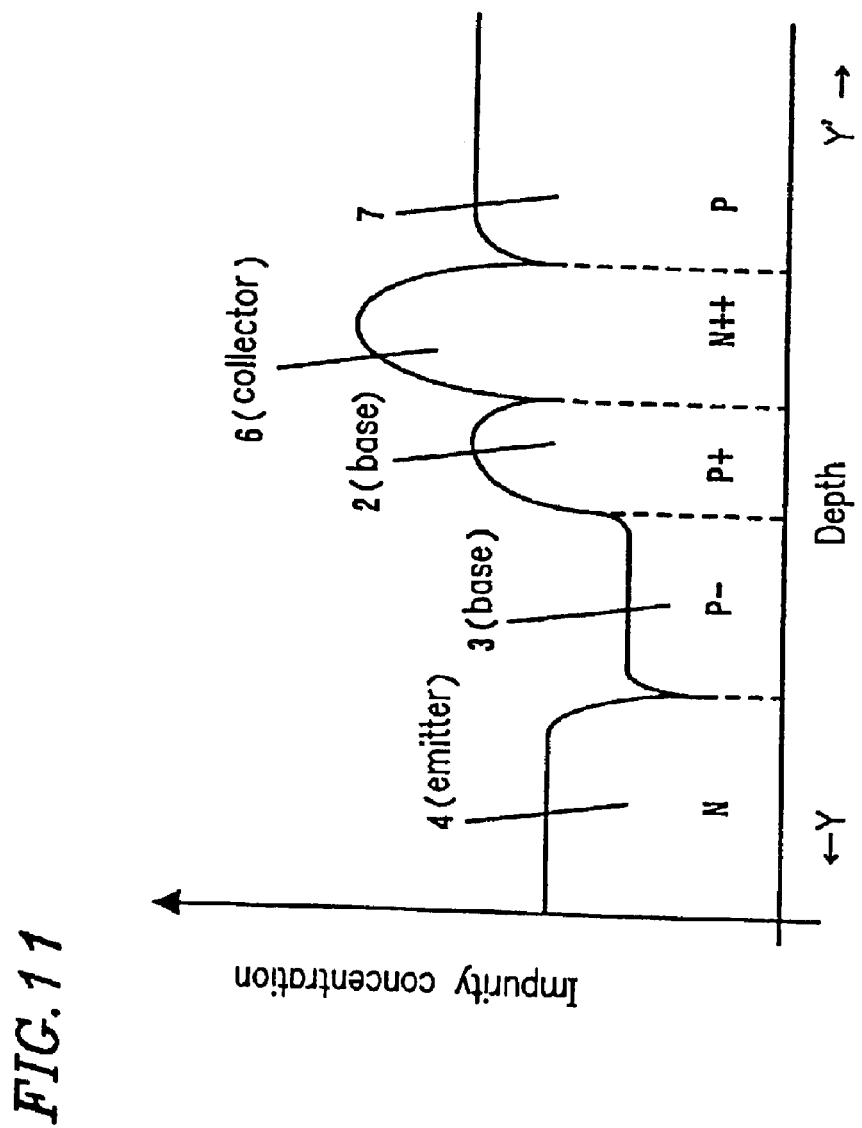
FIG. 11 is a graph showing the relationship in impurity concentration distribution between the emitter region, the base region and the collector region of a parasitic transistor in a cross-sectional structure of the photodiode of Example 2 of the present invention.
Figure 12:
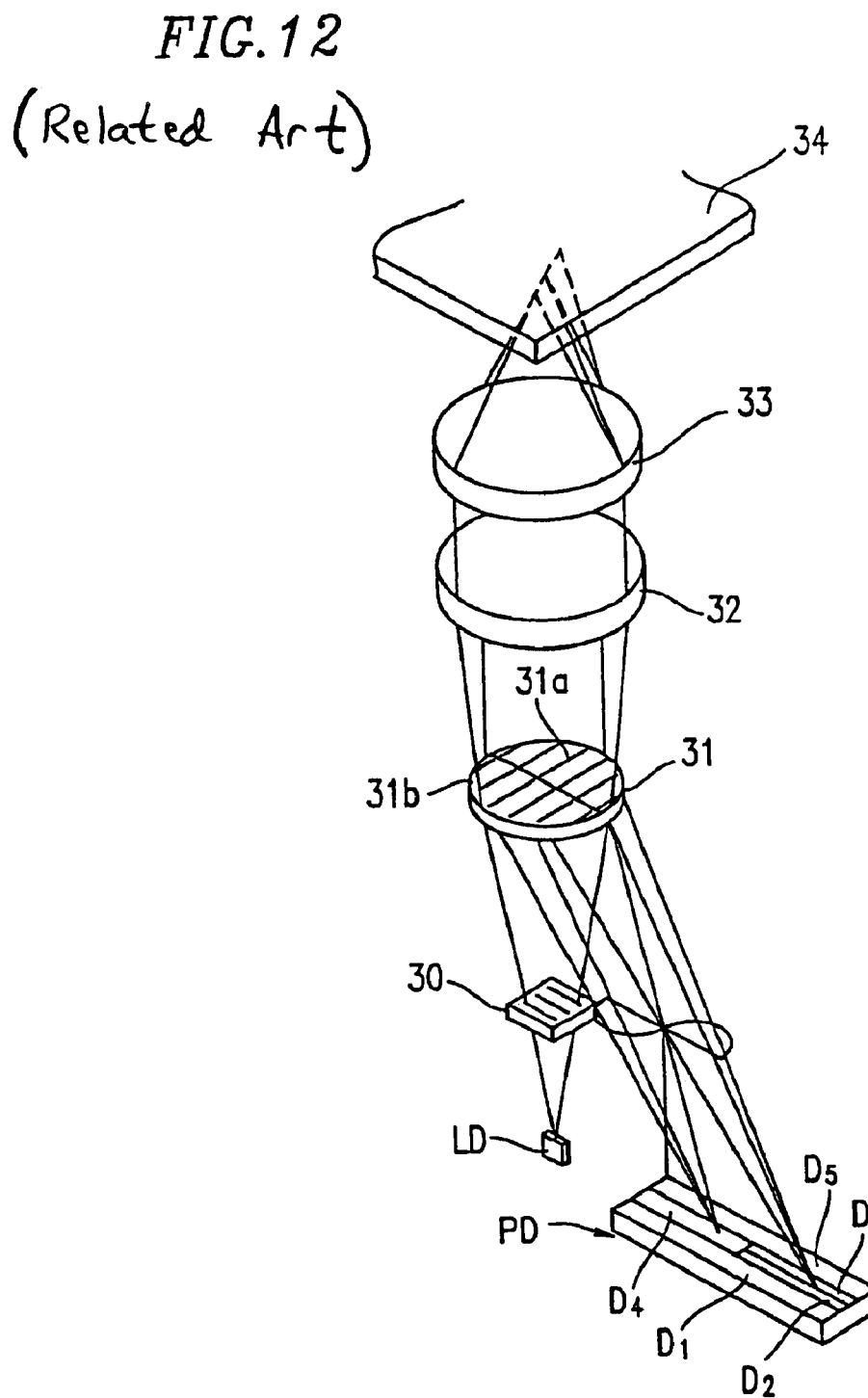
FIG. 12 is a schematic diagram showing a configuration of an optical pickup comprising a photodiode.
Figure 14:
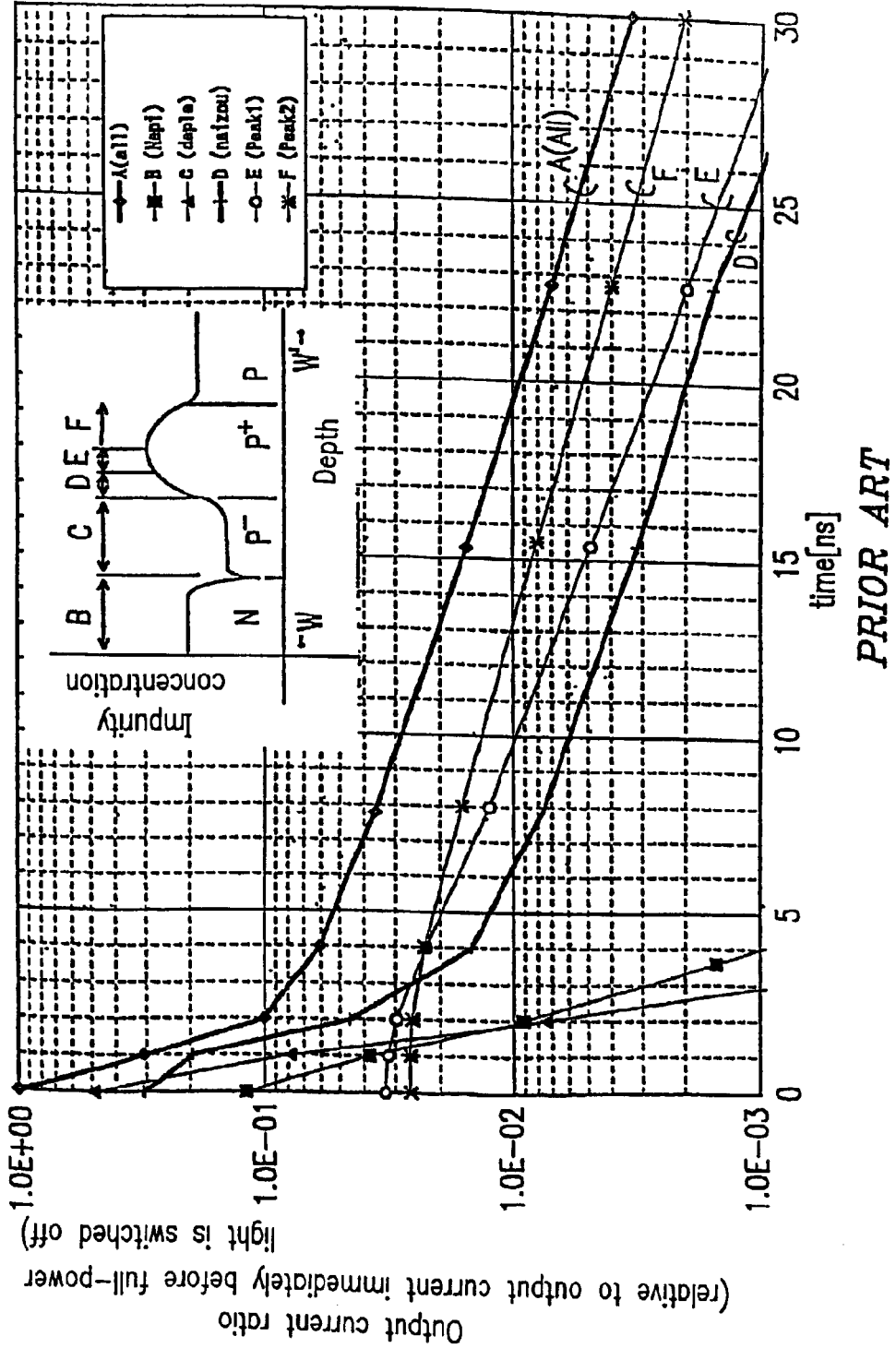
FIG. 14 is a graph showing the response characteristics of a conventional photodiode with respect to pulsed laser light.
Figure 15:
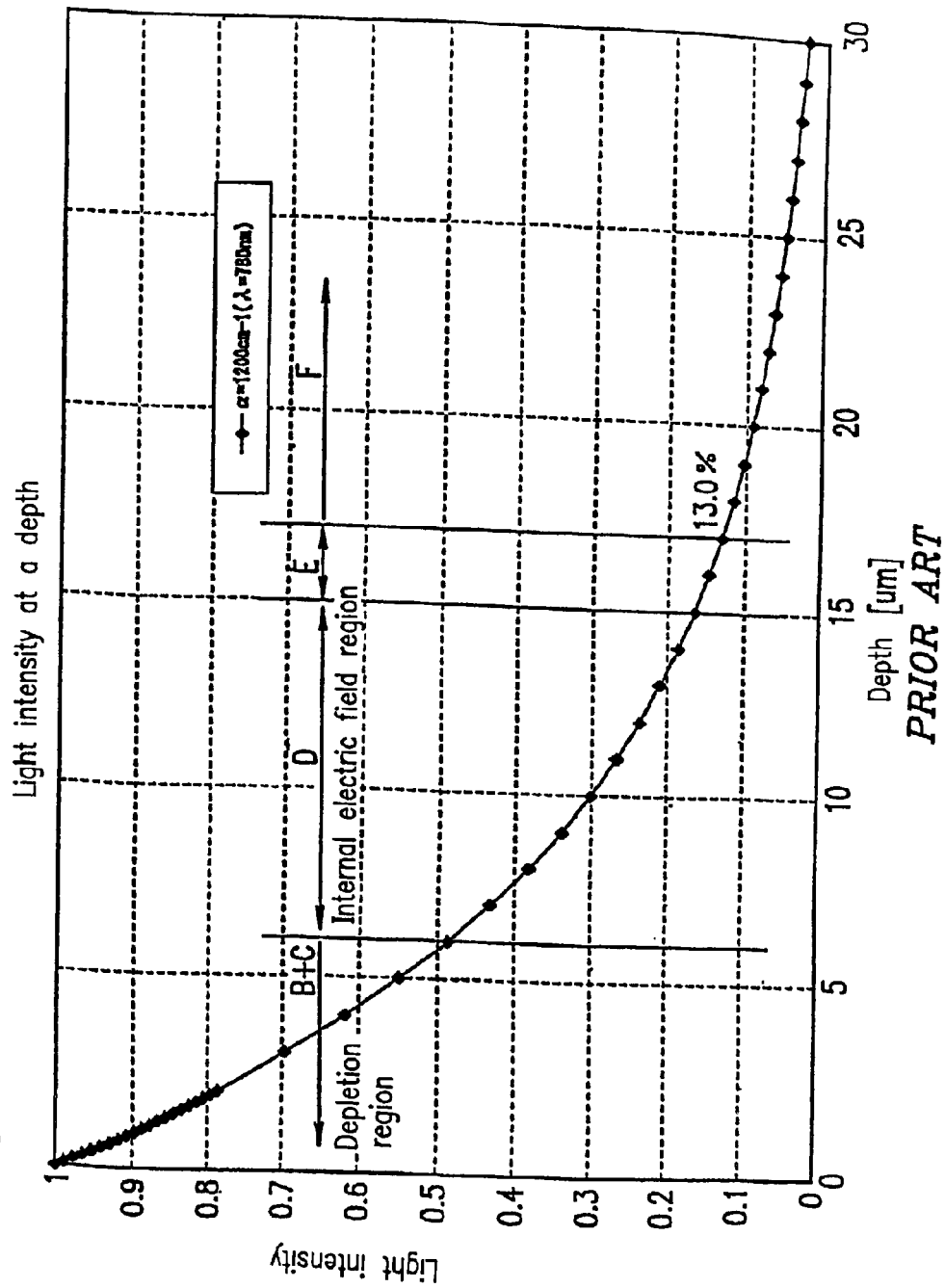
FIG. 15 is a graph showing a change in light intensity from the surface of the photodiode in the depth direction when the reflected light of high-power pulsed laser light enters a conventional photodiode.

Since the structure of the photodiode according to Example 2 of the present invention shown in FIGS. 4A and 4B includes the low resistivity P-type semiconductor substrate 7, a caution should be given to the following point. The potential of the $N^{++}$-type buried diffusion layer 6 provided between the $P^+$-type buried diffusion layer 2 and the low resistivity P-type semiconductor substrate 7 is higher than the potential of these (2 and 7). Therefore, referring to FIG. 11, a parasitic NPN transistor emerges in the photodiode structure, where the N-type epitaxial layer 4, the high resistivity P-type epitaxial layer 3 and the $P^+$-type buried diffusion layer 2, and the $N^{++}$-type buried diffusion layer 6, function as an emitter region, a base region, and a collector regions, respectively. In this case, carriers are injected into the P-type epitaxial layer 3 (base region). Therefore, the photoelectric current level of the photodiode may not be attenuated by a factor of 2/100th or less at which level an address signal can be read out. This phenomenon occurs when the density of photocarriers generated in the $N^{++}$-type buried diffusion layer 6 (collector region) is abnormally increased, but does not usually occur. For example, if the junction area of the PN junction region between the $N^{++}$-type buried diffusion layer 6 and the $P^+$-type buried diffusion layer 2 is greater than or equal to $0.25 \text{ mm}^2$, photocarriers generated in the $N^{++}$-type buried diffusion layer 6 are laterally diffused, so that the photocarrier density of the $N^{++}$-type buried diffusion layer 6 is decreased, and a reduction in the response speed of the photodiode due to the above-described phenomenon is prevented.

The potential of the frame of an optical pickup comprising the photodiode is preferably fixed to the ground (GND: the earth). By fixing the potential of the frame of the optical pickup to the ground, the potential of the low resistivity P-type semiconductor substrate 7 is fluctuated and the potential of the $N^{++}$-type buried diffusion layer 6 is made unstable, thereby making it possible to prevent the above-described parasitic NPN transistor from being operated.

EXAMPLE 3

FIG. 5A is a cross-sectional view showing a structure of a light receiving element (photodiode) according to Example 3 of the present invention. FIG. 5B is a graph showing the impurity concentration on a cross section of the photodiode, taken along line Z–Z' in FIG. 5A. Note that in FIG. 5A, an anode electrode, a cathode electrode, signal lines and a surface protection film are not shown.

The photodiode shown in FIG. 5A comprises a semiconductor structure comprising a low resistivity N-type semiconductor substrate 5 (first conductivity type semiconductor layer), and an N$^{++}$-type buried diffusion layer 6 (first conductivity type semiconductor layer) thereon, which has a higher impurity concentration than that of the low resistivity N-type semiconductor substrate 5. On the N$^{++}$-type buried diffusion layer 6, a P$^+$-type buried diffusion layer 2 having a lower impurity concentration than that of the N$^{++}$-type buried diffusion layer 6, a high resistivity P-type epitaxial layer 3 having a lower impurity concentration than that of the P$^+$-type buried diffusion layer 2, and an N-type epitaxial layer 4, are laminated in this order. In other respects, the photodiode of FIG. 5A has a similar structure to that of the photodiode of FIG. 1A.

An N-type semiconductor layer corresponding to the N-type epitaxial layer 4 may be an N-type diffusion layer such that a surface of the N-type semiconductor layer is exposed at a thermal diffusion region that is buried in the high resistivity P-type epitaxial layer 3 from a surface of the high resistivity P-type epitaxial layer 3.

The impurity concentration distribution of the photodiode shown in FIG. 5A from the surface to the inside, is shown in FIG. 5B.

The impurity concentration distributions of the low resistivity N-type semiconductor substrate 5 and the N$^{++}$-type buried diffusion layer 6 are different from the impurity concentration distribution of the N$^+$-type semiconductor substrate 1 in FIG. 1B. In the other regions, the photodiode of FIG. 5A has a similar impurity concentration distribution to that in the photodiode of FIG. 1A.

Therefore, the photodiode of FIGS. 5A and 5B has the same effects of the photodiode of FIGS. 1A and 1B.

In the photodiode shown in FIG. 5A, on the low resistivity N-type semiconductor substrate 5 implanted with an N-type impurity (phosphor: P) and having a resistivity of 0.1 Ωcm, the N$^{++}$-type buried diffusion layer 6 is formed by diffusing a high concentration N-type impurity of $1 \times 10^{18}$/cm$^3$ or more, for example. Thereafter, on the N$^{++}$-type buried diffusion layer 6, the P$^+$-type buried diffusion layer 2 is formed by diffusing a P-type impurity of $1 \times 10^{17}$/cm$^3$ or more. Thereafter, on the P$^+$-type buried diffusion layer 2, the high resistivity P-type epitaxial layer 3 having an impurity concentration of $1 \times 10^{14}$/cm$^3$ or less by an epitaxial growth method. Thereafter, on the high resistivity P-type epitaxial layer 3, a P$^+$-type separation buried diffusion layer 12 is formed, followed by formation of the N-type epitaxial layer 4 (by an epitaxial growth method) and a P$^+$-type separation buried diffusion layer 11. The P$^+$-type separation buried diffusion layer 11 is formed so as to contact the P$^+$-type separation buried diffusion layer 12 from a surface of the N-type epitaxial layer 4.

Therefore, the N$^{++}$-type buried diffusion layer 6 is formed on the low resistivity N-type semiconductor substrate 5, and the photodiode of FIG. 5A is electrically separated from peripheral circuitry by the P$^+$-type separation buried diffusion layers 11 and 12.

In the photodiode shown in FIG. 5A, a PN junction region is provided at an interface between the N$^{++}$-type buried diffusion layer 6 and the P$^+$-type buried diffusion layer 2. Therefore, as in the photodiode shown in FIG. 1A, photocarriers having a long movement time and a low response speed can be significantly reduced.

In the photodiode shown in FIG. 5A, the N$^{++}$-type buried diffusion layer 6 functions as a potential barrier against carriers (holes) generated in the low resistivity N-type semiconductor substrate 5. Therefore, photocarriers generated in a region deeper than the N$^{++}$-type buried diffusion layer 6 are certainly prevented from being moved to the depletion layer at the interface between the high resistivity P-type epitaxial layer 3 and the N-type epitaxial layer 4. Thereby, photocarriers having a long movement time and a low response speed can be further reduced.

Figure 6:
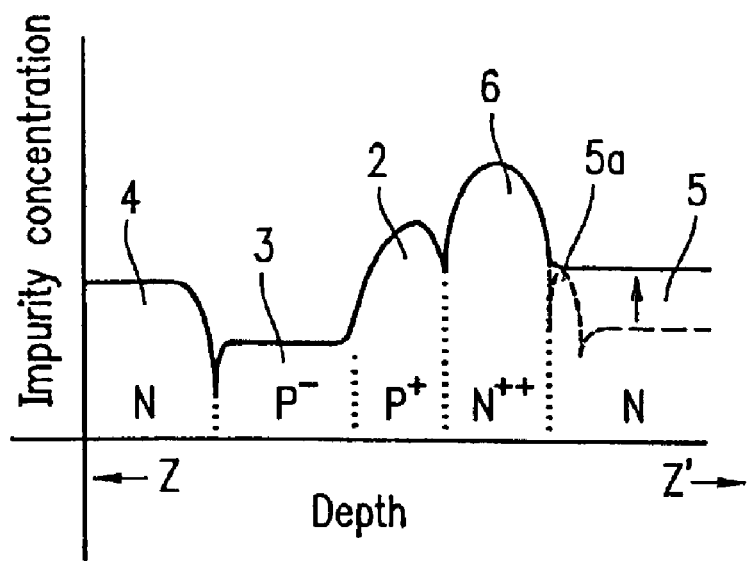
FIG. 6 is a graph for explaining the impurity concentration distribution of a low-resistance N-type semiconductor substrate in the photodiode shown in FIG. 5A.

The low resistivity N-type semiconductor substrate 5 is preferably designed to have an impurity concentration higher than the concentration of a P-type impurity which is diffused from the P$^+$-type buried diffusion layer 2 over the low resistivity N-type semiconductor substrate 5 across the N$^{++}$-type buried diffusion layer 6 onto the low resistivity N-type semiconductor substrate 5. If the concentration of the P-type impurity which is diffused into the low resistivity N-type semiconductor substrate 5 is higher than the impurity concentration of the low resistivity N-type semiconductor substrate 5, a P-type diffusion layer 5a is formed between the N$^{++}$-type buried diffusion layer 6 and the low resistivity N-type semiconductor substrate 5, as indicated with a dashed line in FIG. 6, and the N$^{++}$-type buried diffusion layer 6, is electrically separated from the low resistivity N-type semiconductor substrate 5. Therefore, in order to avoid such electrical separation between the N$^{++}$-type buried diffusion layer 6 and the low resistivity N-type semiconductor substrate 5, the low resistivity N-type semiconductor substrate 5 is designed to have an impurity concentration higher than the concentration of the P-type impurity which is diffused into the low resistivity N-type semiconductor substrate 5.

For example, the resistivity of the low resistivity N-type semiconductor substrate 5 is preferably smaller than or equal to 0.5 Ωcm.

The impurity concentration of the N$^{++}$-type buried diffusion layer 6 is preferably designed to be higher than the impurity concentration of the P$^+$-type buried diffusion layer 2.

The N-type impurity of the N$^{++}$-type buried diffusion layer 6 is preferably antimony (Sb).

The P-type impurity of the P$^+$-type buried diffusion layer 2 is preferably boron (B).

The slope of the impurity concentration distribution profile of the N$^{++}$-type buried diffusion layer 6 or the P$^+$-type buried diffusion layer 2 is preferably steep. To meet this requirement, an epitaxial growth method is preferably used.

The thickness (diffusion width) of the N$^{++}$-type buried diffusion layer 6 is preferably 7 μm or less. If the thickness of the N$^{++}$-type buried diffusion layer 6 is broadly increased, the vicinity of the peak of the impurity concentration of the P$^+$-type buried diffusion layer 2 is not steep. In this case, photocarriers having a low response speed are not reduced. If the total amount of the impurity in the N$^{++}$-type buried diffusion layer 6 is the same, the smaller (shallower) the thickness (diffusion depth) of the N$^{++}$-type buried diffusion layer 6, the higher the peak of the impurity concentration in the impurity concentration distribution. This is an advantage in terms of production.

Since the photodiode shown in FIG. 5A employs the low resistivity N-type semiconductor substrate 5 having a lower impurity concentration than that of the N$^+$-type semiconductor substrate 1, it is not necessary to prevent auto-doping from the low resistivity N-type semiconductor substrate 5 to the surface of the photodiode, thereby making it easy to produce the photodiode.

Note that although in the photodiode according to Example 3 of the present invention shown in FIG. 5A, the N-type epitaxial layer 4 is provided on the high resistivity P-type epitaxial layer 3, an N-type diffusion layer or the like may be buried in the high resistivity P-type epitaxial layer 3 as disclosed in Japanese Laid-Open Publication No. 10-107243. In this case, the same effects are obtained.

EXAMPLE 4

Figure 7:
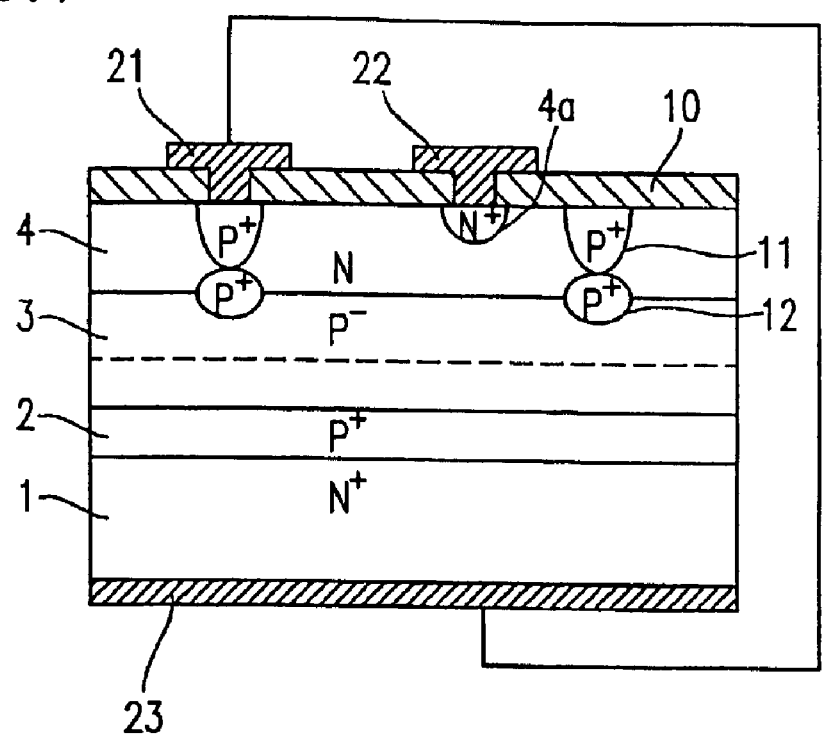
FIG. 7 is a cross-sectional view showing a light receiving element (photodiode) according to Example 4 of the present invention.

FIG. 7 is a cross-sectional view showing a light receiving element (photodiode) according to Example 4 of the present invention.

The photodiode of FIG. 7 comprises an N$^+$-type semiconductor substrate 1 having an impurity concentration, and a P$^+$-type buried diffusion layer 2 having a lower impurity concentration than that of the substrate 1, a high resistivity P-type epitaxial layer 3 having a lower impurity concentration than that of the P$^+$-type buried diffusion layer 2, and an N-type epitaxial layer 4, which are laminated in this order on the substrate 1. Thus, the photodiode has a multilayer structure. A plurality of P$^+$-type separation buried diffusion layers 12 are provided in predetermined regions at an interface between the high resistivity P-type epitaxial layer 3 and the N-type epitaxial layer 4. A P$^+$-type separation buried diffusion layer 11 is provided on each P$^+$-type separation buried diffusion layer 12 within the N-type epitaxial layer 4. A surface of the P$^+$-type separation buried diffusion layer 11 is exposed from a surface of the N-type epitaxial layer 4.

An insulating protection film 10 is provided on surfaces of the N-type epitaxial layer 4 and the P$^+$-type separation buried diffusion layer 11. A contact hole is provided in the insulating protection film 10 on one P$^+$-type separation buried diffusion layer 11. An anode electrode 21 is provided in the contact hole to be connected to the P$^+$-type separation buried diffusion layer 11. A contact hole is also provided in a predetermined region on the N-type epitaxial layer 4 between the P$^+$-type separation buried diffusion layers 11. A cathode electrode 22 is provided in the contact hole. An N$^+$-type diffusion layer 4a is provided in the N-type epitaxial layer 4 below the cathode electrode 22 and is connected to the cathode electrode 22. An N-type electrode 23 is provided on a rear surface of the N$^+$-type semiconductor substrate 1. The N-type electrode 23 and the anode electrode 21 are connected to each other with an external line.

An N-type semiconductor layer corresponding to the N-type epitaxial layer 4 maybe an N-type diffusion layer, such that a surface of the N-type semiconductor layer is exposed by thermal diffusion, being buried in the high resistivity P-type epitaxial layer 3 from a surface of the high resistivity P-type epitaxial layer 3.

If the power of reflected light entering from an optical disk to the photodiode of FIG. 7 is increased, photocarriers are increasingly generated within the N$^+$-type semiconductor substrate 1 of the photodiode. As the photocarriers are increased, some photocarriers go beyond the potential barrier (i.e., a PN junction region provided at an interface between the N$^+$-type semiconductor substrate 1 and the P$^+$-type buried diffusion layer 2) and an electric field due to the impurity concentration distribution, and reach a depletion layer at an interface between the high resistivity P-type epitaxial layer 3 and the N-type epitaxial layer 4.

In order to prevent such movement of the photocarriers, it is necessary to short between the potentials of the N$^+$-type semiconductor substrate 1 and the P$^+$-type separation buried diffusion layer 11, or to connect the N$^+$-type semiconductor substrate 1 to a high potential, so as to make the substrate 1 electrically stable. To meet this requirement, as shown in FIG. 7, the N-type electrode 23 is provided on the rear surface of the N$^+$-type semiconductor substrate 1, and the N-type electrode 23 and the anode electrode 21 on the P$^+$-type separation buried diffusion layer 11, are connected to each other with an external line. Typically, the P$^+$-type separation buried diffusion layer 11 is grounded via the anode electrode 21. Therefore, the N-type electrode 23 on the rear surface of the N$^+$-type semiconductor substrate 1 may be grounded, or may be connected to a high potential.

Figure 8:
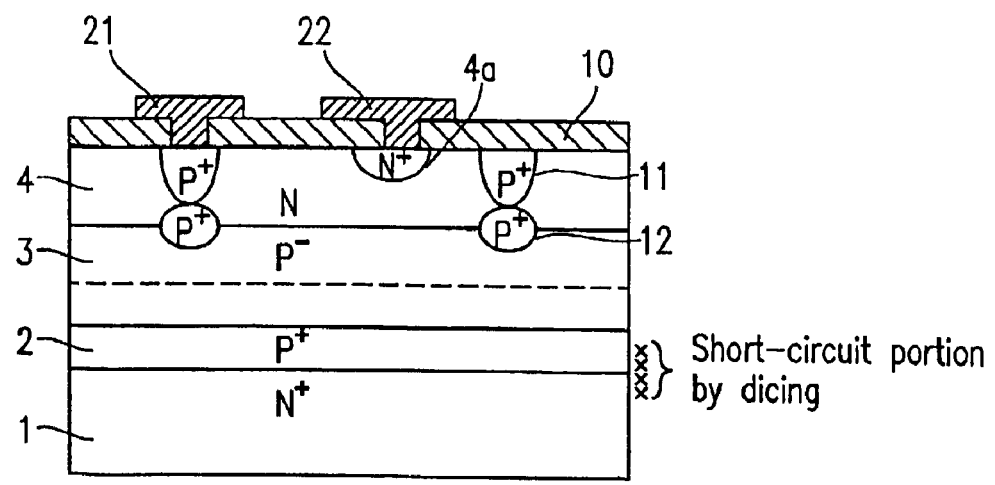
FIG. 8 is a cross-sectional view of the photodiode of FIG. 7, showing the short circuit state of the junction interface of a PN junction region of the photodiode.

Referring to FIG. 8, in a process for producing photodiodes on a wafer, the wafer may be cleaved into chips by dicing or the like, in such a manner that the end face of each chip corresponds to a junction interface of a PN junction region to be shorted (a portion to be shorted by dicing). The same effect as that of the above-described shorting method is obtained.

In any of the above-described Examples, a signal processing circuit (not shown) for processing a signal detected by the photodiode of the present invention can be provided around the photodiode using a commonly used process, whereby a light detector with built-in circuitry can be easily produced using a commonly used process. Therefore, it is possible to easily produce the photodiode of the present invention or an optical pickup comprising the light detector with built-in circuitry.

In Examples 3 and 4 of the present invention, an N-type semiconductor substrate is employed, so that the potential of the N$^{++}$-type buried diffusion layer 6 can be fixed. Therefore, the N$^{++}$-type buried diffusion layer 6 is not necessarily provided on the entire wafer, and may be provided at least in a photodiode region. In Example 2 of the present invention, if the potential of the N$^{++}$-type buried diffusion layer 6 can be made stable by a certain method to prevent the behavior of a parasitic NPN transistor, the N$^{++}$-type buried diffusion layer 6 is not necessarily provided on the entire wafer, and may be provided at least in a photodiode region.

In the light receiving element of the present invention, a PN junction region provided at an interface between a semiconductor structure comprising at least a first conductivity type semiconductor layer and a first, second conductivity type semiconductor layer, so that a region in the vicinity of the peak of the impurity concentration of the first, second conductivity type semiconductor layer is narrow, thereby enhancing the intensity of the electric field in this region. Therefore, photocarriers generated in this region, which have a long movement time, and photocarriers generated in a deep region within the semiconductor structure, are prevented from reaching the PN junction region at the interface between a second, first conductivity type semiconductor layer and a second, second conductivity type semiconductor layer and contributing to a photoelectric current, by a potential barrier present in the PN junction region. Further, photocarriers generated in a region deeper than the depletion layer of the light receiving element, for which it takes a long time to be moved to the vicinity of the depletion layer and which has a low response speed, can be certainly reduced.

These and other advantages of the present invention will become apparent to those skilled in the art upon reading and understanding the following detailed description with reference to the accompanying figures.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A light receiving element, comprising:
   a semiconductor structure comprising at least a first, first conductivity type semiconductor layer;
   a first, second conductivity type semiconductor layer provided on a surface of the first, first conductivity type semiconductor layer in the semiconductor structure;
   a second, second conductivity type semiconductor layer having impurity concentration lower than that of the first, second conductivity type semiconductor layer;
   a second, first conductivity type semiconductor layer provided on the second, second conductivity type semiconductor layer, or a second, first conductivity type semiconductor layer provided within the second, second conductivity type semiconductor layer.

2. A light receiving element according to claim 1, wherein the first, first conductivity type semiconductor layer is a first conductivity type semiconductor substrate.

3. A light receiving element according to claim 2, wherein an impurity element contained in the first conductivity type semiconductor substrate is antimony (Sb).

4. A light receiving element according to claim 2, wherein the first conductivity type semiconductor substrate of the semiconductor structure is connected to a potential with an external line, the potential being sufficiently high to make the first conductivity type semiconductor substrate stable.

5. A light receiving element according to claim 1, wherein the semiconductor structure further comprises a second conductivity type semiconductor substrate, and the first, first conductivity type semiconductor layer is provided on a surface of the second conductivity type semiconductor substrate.

6. A light receiving element according to claim 5, wherein an impurity element contained in the first, first conductivity type semiconductor layer is antimony (Sb).

7. A light receiving element according to claim 5, wherein the thickness of the first, first conductivity type semiconductor layer is smaller than or equal to 7 µm.

8. A light receiving element according to claim 1, wherein the semiconductor structure further comprises a first conductivity type semiconductor substrate, and the first, first conductivity type semiconductor layer is provided on a surface of the first conductivity type semiconductor substrate.

9. A light receiving element according to claim 8, wherein an impurity element contained in the first conductivity type semiconductor substrate is antimony (Sb).

10. A light receiving element according to claim 8, wherein the thickness of the first, first conductivity type semiconductor layer is smaller than or equal to 7 µm.

11. A light receiving element according to claim 8, wherein the impurity concentration of the first conductivity type semiconductor substrate is designed to be higher than an impurity concentration such that the impurity is diffused from the first, first conductivity type semiconductor layer and reaches the first conductivity type semiconductor substrate.

12. A light receiving element according to claim 8, wherein the resistivity of the first conductivity type semiconductor substrate is smaller than or equal to 0.5 Ωcm.

13. A light receiving element according to claim 1, wherein an impurity element contained in the first, first conductivity type semiconductor layer is antimony (Sb).

14. A light receiving element according to claim 1, wherein an impurity element contained in the first, second conductivity type semiconductor layer is boron (B).

15. A light receiving element according to claim 1, wherein the first, second conductivity type semiconductor layer has an impurity concentration of $1 \times 10^{16}$ to $2 \times 10^{18}$ $cm^{3}$.

16. A light receiving element according to claim 1, wherein the total thickness (d) of the second, first conductivity type semiconductor layer and the second, second conductivity type semiconductor layer is designed to satisfy the following expression:

$$\mathrm{EXP}(-Gd) < 0.02$$

where G represents the absorption coefficient of incident light.

17. A light receiving element according to claim 1, wherein the thickness of the second, second conductivity type semiconductor layer is designed such that the intensity of an electric field generated in a PN junction region at an interface between the second, second conductivity type semiconductor layer and the second, first conductivity type semiconductor layer, when applying a reverse bias voltage to the PN junction region, is greater than or equal to 0.3 V/µm.

18. A light receiving element according to claim 1, wherein the first, first conductivity type semiconductor layer is an epitaxial growth layer.

19. A light receiving element according to claim 1, wherein the second, first conductivity type semiconductor layer is an epitaxial growth layer.

20. A light receiving element according to claim 1, wherein the second, first conductivity type semiconductor layer has a diffusion region provided from a surface of the second, second conductivity type semiconductor layer.

21. A light receiving element according to claim 1, wherein the first, second conductivity type semiconductor layer is an epitaxial growth layer.

22. A light receiving element according to claim 1, wherein the impurity concentration of the first, second conductivity type semiconductor layer is designed to be lower than the impurity concentration of the first, first conductivity type semiconductor layer in the semiconductor structure.

23. A light receiving element according to claim 1, wherein the intensity of an internal electric field in a region in the vicinity of the peak of the impurity concentration of the first, second conductivity type semiconductor layer is increased relative to an internal electric field outside of the region in the vicinity of the peak of the impurity concentration.

24. A light receiving element according to claim 1, wherein the first, second conductivity type semiconductor layer and the first, first conductivity type semiconductor layer of the semiconductor structure are shorted at an end face of a chip.

25. A light receiving element according to claim 1, wherein the junction area of a PN junction region at an interface between the first, second conductivity type semiconductor layer and the first, first conductivity type semiconductor layer of the semiconductor structure is greater than or equal to 0.25 $mm^2$.

26. A light receiving element according to claim 1, wherein the first, second conductivity type semiconductor layer and the first, first conductivity type semiconductor layer in the semiconductor structure are shorted with an external line.

27. A light detector with built-in circuitry, comprising:

a light receiving element according to claim 1; and a signal processing circuit for processing a signal detected by the light receiving element, wherein the light receiving element and the signal processing circuit are provided on the same substrate.

28. A light detector with built-in circuitry according to claim 27, wherein the first, first conductivity type semiconductor layer of the semiconductor structure provided in the light receiving element, is not disposed at least in a region in which the signal processing circuit is provided.

29. An optical pickup, comprising a light detector with built-in circuitry according to claim 27.

30. An optical pickup, comprising:

a light receiving element according to claim 1.

31. An optical pickup according to claim 30, wherein a frame carrying the light receiving element is connected to the ground (GND).

* * * * *